United States Patent
Reiter et al.

(10) Patent No.: US 10,916,931 B2
(45) Date of Patent: Feb. 9, 2021

(54) TEMPERATURE SENSING AND FAULT DETECTION FOR PARALLELED DOUBLE-SIDE COOLED POWER MODULES

(71) Applicant: Infineon Technologies AG, Neubiberg (DE)

(72) Inventors: Tomas Manuel Reiter, Munich (DE); Tom Roewe, Unterhaching (DE); Inpil Yoo, Unterhaching (DE)

(73) Assignee: INFINEON TECHNOLOGIES AG, Munich (DE)

( * ) Notice: Subject to any disclaimer, the term of this patent is extended or adjusted under 35 U.S.C. 154(b) by 583 days.

(21) Appl. No.: 15/871,661

(22) Filed: Jan. 15, 2018

(65) Prior Publication Data
US 2019/0222018 A1 Jul. 18, 2019

(51) Int. Cl.
*H02H 5/04* (2006.01)
*H01L 23/473* (2006.01)
(Continued)

(52) U.S. Cl.
CPC .......... *H02H 5/044* (2013.01); *G01N 25/72* (2013.01); *G05B 15/02* (2013.01); *H01L 23/473* (2013.01);
(Continued)

(58) Field of Classification Search
CPC ..... H01L 23/46; H01L 23/467; H01L 23/473; H02M 1/32; H02M 2001/327;
(Continued)

(56) References Cited

U.S. PATENT DOCUMENTS

2003/0072117 A1* 4/2003 Maekawa ............... H02M 1/08
361/86
2006/0284308 A1* 12/2006 Harada ............... H01L 23/4012
257/729
(Continued)

OTHER PUBLICATIONS

Gillot, C. et al., "Double-Sided Cooling for High Power IGBT Modules Using Flip Chip Technology", IEEE Transactions on Components and Packaging Technologies, vol. 24, No. 4, Dec. 2001, 7 pages.
(Continued)

*Primary Examiner* — Jared Fureman
*Assistant Examiner* — Christopher J Clark
(74) *Attorney, Agent, or Firm* — Slater Matsil, LLP

(57) ABSTRACT

In accordance with an embodiment, a method includes: monitoring a temperature difference between two double-side cooled (DSC) power modules of a plurality of DSC power modules arranged in stacks of DSC power modules; comparing the temperature difference with a first temperature threshold; detecting a cooling pipe system blockage when the temperature difference is above the first temperature threshold; and after detecting the cooling pipe system blockage, disabling gate driver circuits coupled to the plurality of DSC power modules or operating the DSC power modules in a low-power mode. Each stack includes a plurality of DSC power modules. Each DSC power module has a top surface and a bottom surface, which are each thermally coupled with one or more cooling channels of a cooling pipe system. The two DSC power modules are thermally coupled with a same cooling channel of the one or more cooling channels.

25 Claims, 11 Drawing Sheets

(51) Int. Cl.
  *H02M 1/32* (2007.01)
  *G01N 25/72* (2006.01)
  *G05B 15/02* (2006.01)
  *H01L 25/10* (2006.01)
  *H05K 7/20* (2006.01)
  *H01L 23/373* (2006.01)
(52) U.S. Cl.
  CPC ....... *H01L 25/105* (2013.01); *H05K 7/20927* (2013.01); *H01L 23/3735* (2013.01); *H02M 2001/327* (2013.01)
(58) Field of Classification Search
  CPC ................ H02M 7/15–19; G01K 3/08; H02H 5/04–048; H03K 2017/0806
  See application file for complete search history.

(56) References Cited

U.S. PATENT DOCUMENTS

2014/0233602 A1* 8/2014 Kitazawa ................ B60L 1/003
                                                              374/45
2016/0351468 A1   12/2016 Liang

OTHER PUBLICATIONS

Li, Y. et al., "Highly Integrated Power Unit Based on Double Side Cooling IGBT Module", PCIM Europe 2017, May 16-18, 2017, Nuemberg, Germany, 6 pages.

\* cited by examiner

TEMPERATURE SENSING AND FAULT DETECTION FOR PARALLELED DOUBLE-SIDE COOLED POWER MODULES

TECHNICAL FIELD

The present invention relates generally to an electronic system and method, and, in particular embodiments, to a temperature sensing and fault detection system for paralleled double-side cooled (DSC) power modules.

BACKGROUND

Transistor devices are widely used as electronic switches in a variety of different applications, such as industrial, automotive, and consumer applications. Those applications may include power conversion, motor drive, induction heating or lighting systems, to name a few.

Power transistors typically switch relatively high power, by carrying relatively high currents and/or blocking high voltages. As a result, heat is typically generated by the power transistor. Since power transistors typically have a maximum operating temperature, poor heat dissipation may limit the performance and the maximum amount of power that can be carried by the power transistor. Power transistors, therefore, typically have packages that can be clamped to a heat sink for enhanced cooling. Some power transistors may use packages with double-side cooling (DSC).

A DSC power transistor is a transistor that has low thermal resistance at two surfaces of the transistor package. Therefore, thermally dissipative components, such as heat sinks, may be attached to each of the low thermal resistance surfaces of the package of the transistors to enhance cooling. Power transistors using DSC, therefore, typically allow for an increase in power density.

Electrical components having more than one power transistor may also be packaged with DSC in a power module. For example, a power module having a half-bridge may be implemented using a package having DSC. Power modules may include one or more power components, such as one or more power transistors as well as antiparallel diodes for freewheeling inductive switched loads.

Some applications use a plurality of power modules in parallel in order to support higher power requirements. The power modules may be implemented with DSC, which may be known as DSC power modules.

SUMMARY

In accordance with an embodiment, a method includes: monitoring a temperature difference between two double-side cooled (DSC) power modules of a plurality of DSC power modules arranged in stacks of DSC power modules; comparing the temperature difference with a first temperature threshold; detecting a cooling pipe system blockage when the temperature difference is above the first temperature threshold; and after detecting the cooling pipe system blockage, disabling gate driver circuits coupled to the plurality of DSC power modules or operating the DSC power modules in a low-power mode. Each stack includes a plurality of DSC power modules. Each DSC power module has a top surface and a bottom surface, which are each thermally coupled with one or more cooling channels of a cooling pipe system. The two DSC power modules are thermally coupled with a same cooling channel of the one or more cooling channels.

BRIEF DESCRIPTION OF THE DRAWINGS

For a more complete understanding of the present invention, and the advantages thereof, reference is now made to the following descriptions taken in conjunction with the accompanying drawings, in which.

Figure 1A:
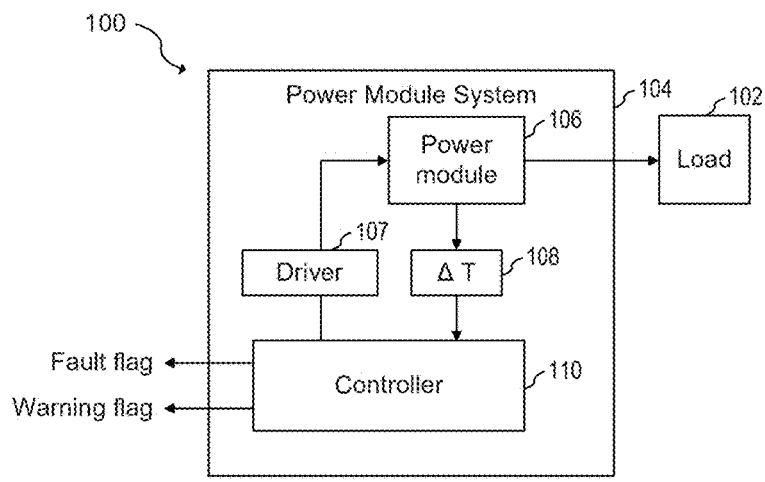
FIG. 1A shows a high level schematic diagram of a power system, according to an embodiment of the present invention.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

For exemplary purposes only, the present invention will be described with respect to embodiments in the context of a temperature sensing and fault detection circuit and method for a power system that includes paralleled DSC power modules, each DSC power module including half-bridges for driving a three-phase electrical motor. However, other embodiments besides those that are explicitly described hereinabove are possible. For example, embodiments of the present invention may also be used for driving loads other than a three-phase motor, such as, for example, single-phase motors, induction coils, high power converters, UPS systems, motors with more than three-phases, or any other high-power load. Some embodiments may include DSC power modules including, in addition or instead of half-bridges, other components such as, for example, single transistors, full-bridges, or any other high power component.

In an embodiment of the present invention, a partial or total blockage of cooling pipes configured to cool stacks of DSC power modules is detected by measuring the difference in temperature between two stacked DSC power modules, one of which is exposed to an obstructed cooling channel and the other one is not. Total blockage is detected by measuring the absolute temperature of any DSC power module in the stack.

Power module systems may be used to drive a high power load. For example, FIG. 1A shows a high level schematic diagram of power system 100, according to an embodiment of the present invention. Power system 100 includes high power load 102, and power module system 104. Power module system 104 includes power module 106, driver 107, differential temperature sensing unit 108 and controller 110.

During normal operation, controller 110 controls driver 107 to drive power module 106, which in turn drives load 102. Power module 106 is thermally coupled with a cooling system (not shown). Differential temperature sensing unit 108 monitors the temperature of power module 106. When differential temperature sensing unit 108 detects a failure based on the temperature of power module 106, differential temperature sensing unit 108 notifies controller 110 of the fault. Controller 110 may control driver 107 and/or set a fault or warning flag to an external user based on the notification from differential temperature sensing unit 108. In some embodiments, controller 110 may disable driver 107, which in turn disable power module 106. In other embodiments, controller 110 may continue to operate driver 107 in a lower power mode, such as a system safe state mode operation. A system safe state mode may be, for example, a mode in which a lower amount of power/heat is generated compared to normal operation. For example, controller 110 may, via driver 107, turn off power module 106, reduce the switching rate of power module 106, or bring power module 106 to a non-switching safe state operation such as by stop switching while leaving either the low-side or high-side transistor of a half-bridge of power module 106 on in order to generate zero torque at the connected drive.

In some embodiments, controller 110 may set a fault flag to notify an external user or users about a fault that occurred in the system. Controller 110 may set a warning flag to notify the external user that a fault may occur in the system. Some embodiments may use different predetermined temperature thresholds for determining whether a fault or a warning has occurred.

The external user may be a circuit coupled to the power module system. For example, in a plug-in electrical vehicle (xEV) where a power module system drives an electrical motor of the car, a controller of the xEV may be notified when power module 106 overheats.

Load 102 may be a three-phase electrical motor. Other high power loads may be used. For example, load 102 may be single-phase motors, induction coils, high power converters, UPS systems, or any other high-power load.

Driver 107 may be implemented as a buffer or amplifier that is configured to drive the control nodes of transistors of the power module. Other implementations are possible.

Figure 1B:
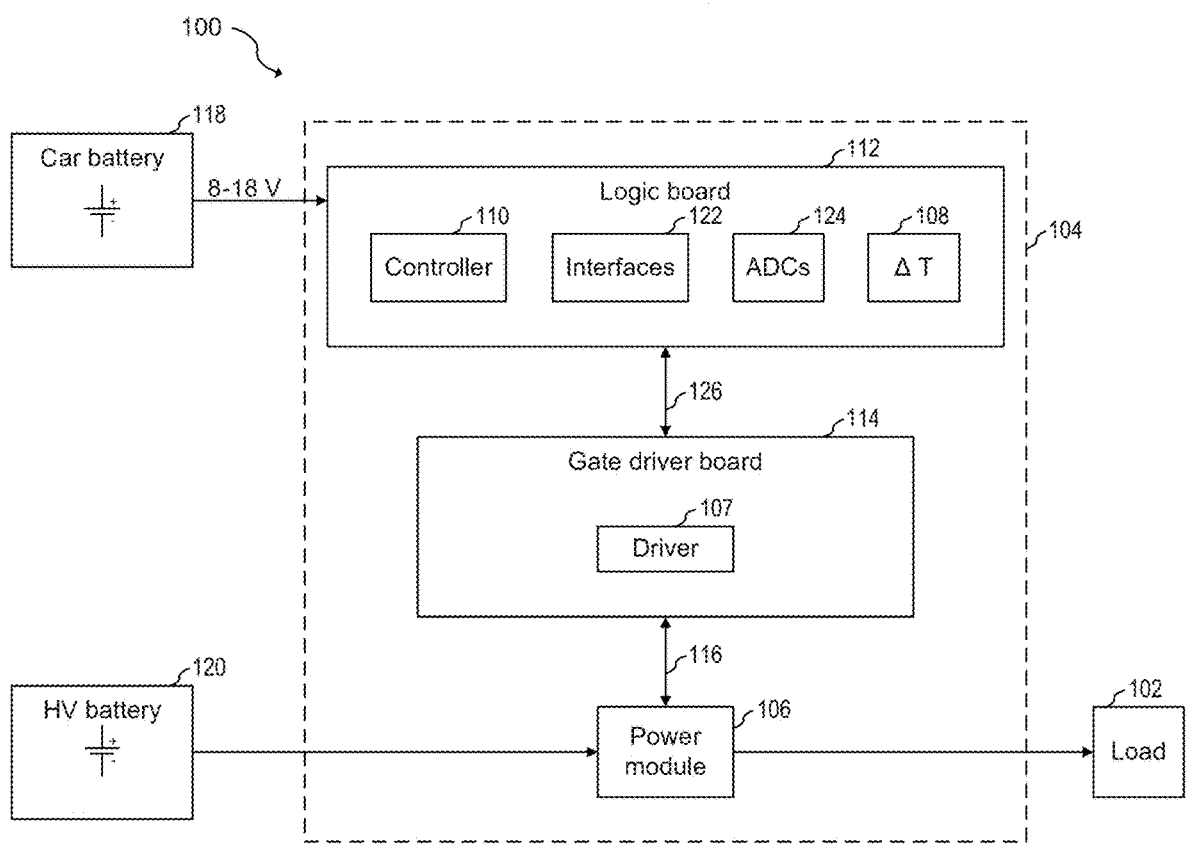
FIG. 1B shows a possible implementation of the power system of FIG. 1A, according to an embodiment of the present invention.

In some embodiments, power module system 104 may be implemented with a logic board, a gate driver board, and a power module. For example, FIG. 1B shows a possible implementation of power system 100, according to an embodiment of the present invention. As shown in FIG. 1B, power module system 104 may be implemented with logic board 112, gate driver board 114 and power module 106.

In some embodiments, a car battery, such as car battery 118, may supply power to logic board 112. A high voltage battery (e.g., 450 V or a vehicle voltage of the ISO PAS 19295, which describes voltages from 220 V up to more than 1 kV), such as high voltage battery 120, may supply power to power module 106. Other implementations are also possible. Some embodiments may use batteries with voltages higher than 1 kV.

Logic board 112 may include controller 110, and differential temperature sensing unit 108. Logic board 112 may also include interfaces module 122, which may include communication interfaces such as controller area network (CAN), and/or USB, as well as motor interfaces, for example. Logic board 112 may also include one or more analog-to-digital converters (ADCs), such as ADCs 124. ADCs 124 may be used, for example, for converting signals associated with the temperature of power module 106. Logic board 112 may be implemented with, for example, with printed circuit board (PCB) technologies known in the art. Other implementations are also possible.

Gate driver board 114 may include driver 107. Gate driver board may be implemented with, for example, PCB technologies known in the art.

Communication between logic board 112 and gate driver board 114 may be achieved, for example, with PCB connector 126. PCB connector 126 may be used to supply power as well as for communication signals, such as SPI and PWM signals) between controller 110 and driver 107, among other functions.

Gate driver board 114 may be connected to power module 106 with signal connector 116. Signal connector 116 may carry signals for driving power module 106. Signal connector 116 may be implemented, for example, using PressFIT signal connectors. Other implementations may be used.

Figure 2:
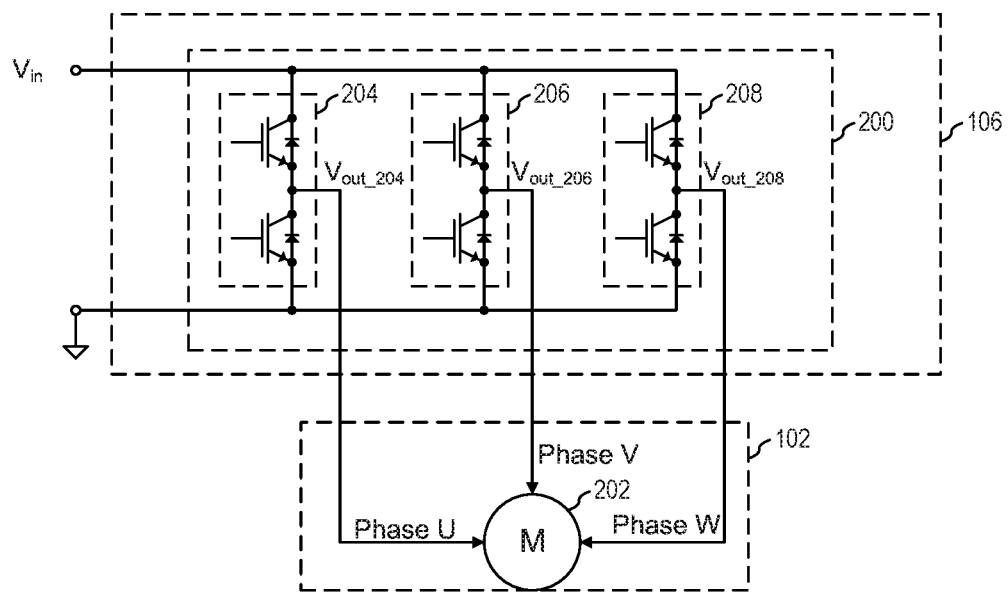
FIG. 2 shows a schematic diagram of an inverter circuit for driving a three-phase electrical motor, according to an embodiment of the present invention.

In some embodiments, a power module system such as power module system 104 may be used to power a three-phase electrical motor. Power to the three-phase motor may be provided, for example, by three half-bridges, where each half-bridge provides power to a respective phase. For example, FIG. 2 shows a schematic diagram of inverter circuit 200 for driving three-phase electrical motor 202, according to an embodiment of the present invention. Inverter circuit 200 includes half-bridges 204, 206, and 208. Inverter circuit 200 may be referred to as a B6-bridge.

In some embodiments, the transistors of each half-bridge 204, 206, and 208 may be insulated gate bipolar transistors (IGBT). Other types of transistors may be used. For example, transistors of the n-type and p-type, metal oxide semiconductor field effect transistors (MOSFETs), power MOSFETs, junction field effect transistor (JFETs) high electron mobility transistor (HEMT) such as gallium nitride (GaN) HEMTs, silicon carbide (SiC) transistors, and others.

Figure 3A:
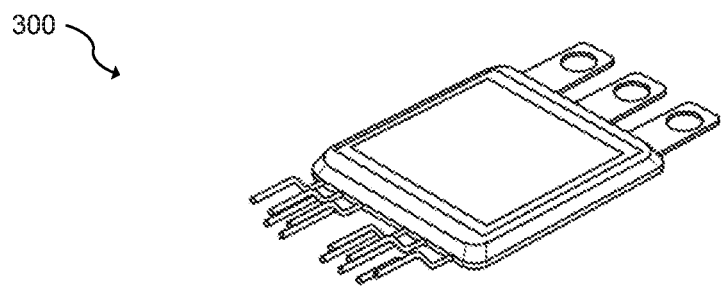
FIG. 3A shows a picture of a DSC power module including a half-bridge, according to an embodiment of the present invention.

Three-phase electrical motor 202 may be a high power motor, such as the electrical motor of an electrical vehicle, such as an xEV. For example, three-phase motor 202 may be a 20 kW to 300 kW motor, depending on the vehicle size and acceleration power. The voltage at input $V_{in}$ may be, for example, 450 V or a vehicle voltage of the ISO PAS 19295, which describes voltages from 220 V up to more than 1 kV. Each of half-bridges 204, 206, and 208, therefore, may dissipate a substantial amount of heat. To improve thermal performance, each of half-bridges 204, 206, and 208 may be packaged with a DSC package. For example, FIG. 3A shows a picture of DSC power module 300 including a half-bridge, according to an embodiment of the present invention. In some embodiments, a driver such as inverter circuit 200 may include three DSC power modules 300, one for each of half-bridges 204, 206 and 208, respectively.

Figure 3B:
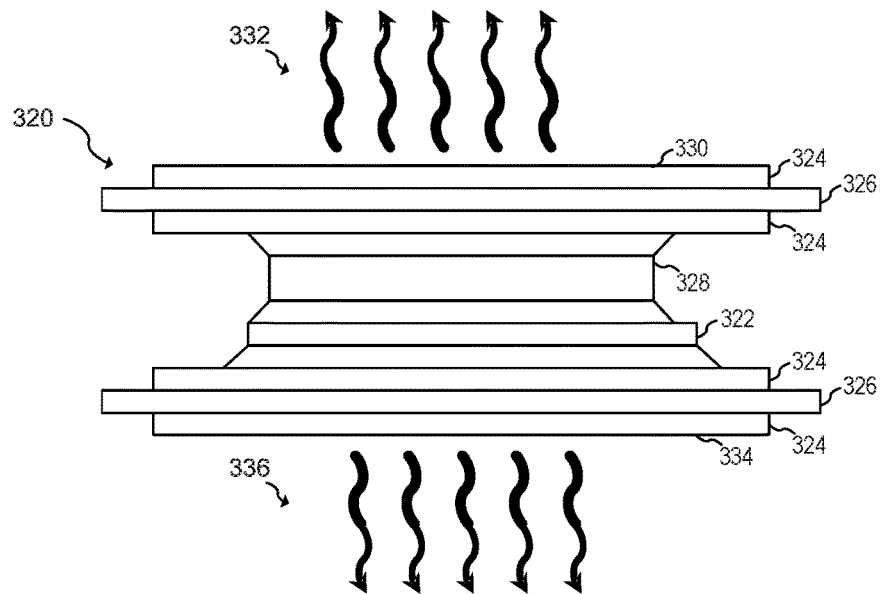
FIG. 3B shows a thermal stack of the DSC power module of FIG. 3A, according to an embodiment of the present invention.

FIG. 3B shows thermal stack 320 of DSC power module 300, according to an embodiment of the present invention. Thermal stack 320 includes chip 322, thermal and electric conductor layers 324, isolation layers 326, and spacer 328. Thermal conductor layers 324 may be, for example, copper layers. Isolation layers 326 may be, for example, ceramic layers. Chip 322 may be, for example, a chip including any of half-bridges 204, 206 or 208. In thermal stack 320, heat may dissipate via top surface 330 as shown by heat flow 332. Heat may also dissipate via bottom surface 334 as shown by heat flow 336.

Figure 4:
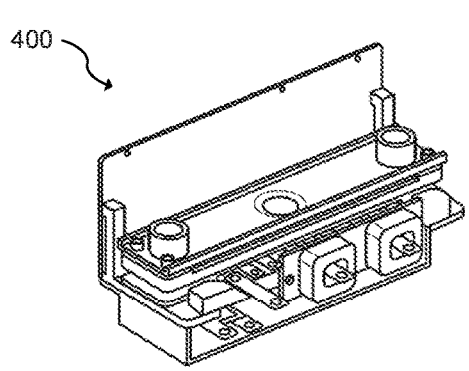
FIG. 4 shows a perspective view of a three-phase inverter system having DSC power modules in a B6 inverter configuration, according to an embodiment of the present invention.

Power modules, such as power module 106, implementing DSC power modules, such as DSC power modules 300, for driving loads, such as three-phase electric motor 202, may be implemented in a compact way. For example, FIG. 4 shows a perspective view of three-phase inverter system 400 having DSC power modules, such as power modules 300, in a B6 inverter configuration, such as the configuration of inverter circuit 200, according to an embodiment of the present invention. In some embodiments, three-phase inverter system 400 may include a controller, such as controller 110, and a differential temperature sensing unit, such as temperature sensing unit 108. In some embodiments, a portion or the entirety of temperature sensing unit 108 may be implemented inside controller 110. Other embodiments may implement the controller and sensing unit external to three-phase inverter system 400.

Figure 5:
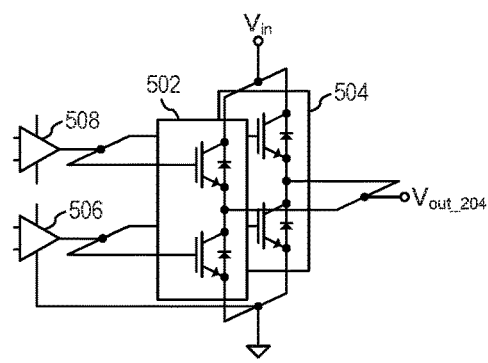
FIG. 5 shows a schematic diagram of a driver of an inverter circuit having two half-bridges implemented in parallel, according to an embodiment of the present invention.

To increase the power capabilities of inverter circuits, such as inverter circuit 200, multiple half-bridges may be implemented in parallel. For example, an inverter circuit may be implemented with two half-bridges in parallel for each of the phases. Using three half-bridges in parallel, four half-bridges in parallel or more for each of the phases is also possible. FIG. 5 shows a schematic diagram of a driver of a phase of a three-phase inverter circuit having two half-bridges implemented in parallel for each of the phases, according to an embodiment of the present invention. As shown in FIG. 5, drivers 508 and 506 drive the high side and low side transistors, respectively, of half-bridges 502 and 504. As shown, half-bridge 502 and 504 are connected in parallel. In particular the control gates of the high side transistors of half-bridges 502 and 504 are connected to each other, the control gates of the low side transistors of half-bridges 502 and 504 are connected to each other, the outputs of half-bridges 502 and 504 are connected to each other, and supply terminals of half-bridges 502 and 504 are connected to each other. Parallel connected power switches may be driven by the same gate driver, as shown by drivers 506 and 508.

Figure 6A:
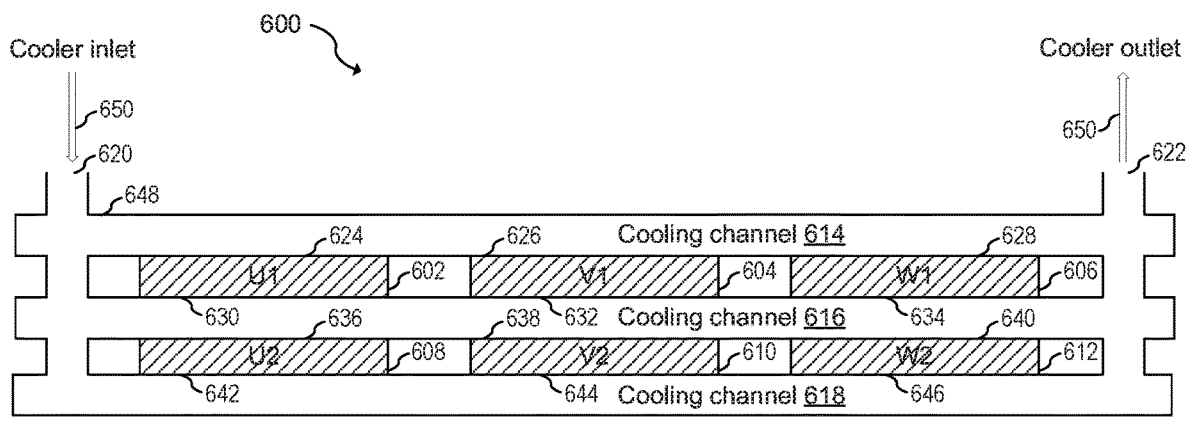
FIGS. 6A and 6B show a cross-sectional view and a perspective view, respectively, of a three-phase inverter system having two parallel half-bridge modules, according to an embodiment of the present invention.
Figure 6B:
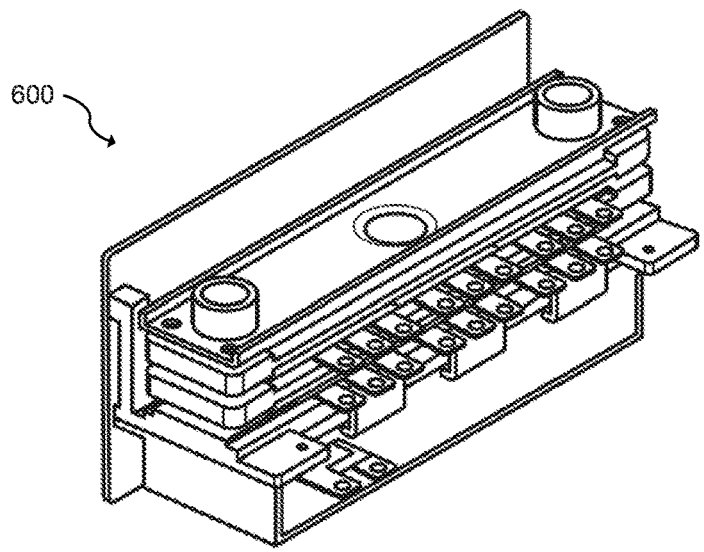

Given the double side nature of DSC power modules, each of the DSC power modules of an inverter circuit having a parallel configuration may be stacked together with cooling channels contacting each of the cooling surfaces of each DSC power module. For example, FIGS. 6A and 6B show a cross-sectional view and a perspective view, respectively, of three-phase inverter system 600, which has two parallel half-bridge modules, according to an embodiment of the present invention. Inverter system 600 includes two half-bridges connected in parallel for each of the phases. Three-phase inverter system 600 includes DSC power modules 602, 604, 606, 608, 610, and 612, cooling channels 614, 616 and 618, inlet port 620 and outlet port 622. DSC power modules 602, 604, 606, 608, 610, and 612 each include a half-bridge circuit (not shown). DSC power modules 602 and 608 are coupled in parallel to drive the U phase of three-phase inverter power system 600, power modules 604 and 610 are coupled in parallel to drive the V phase of three-phase inverter power system 600, and power modules 606 and 612 are coupled in parallel to drive the W phase of three-phase inverter power system 600.

As shown in FIG. 6A, cooling channel 614 is in contact with top surfaces 624, 626 and 628 of DSC power modules 602, 604 and 606, respectively. Cooling channel 616 is in contact with bottom surfaces 630, 632, and 634 of DSC power modules 602, 604 and 606, respectively, as well as with top surfaces 636, 638, and 640 of power modules 608, 610, and 612, respectively. Cooling channel 618 is in contact with bottom surfaces 642, 644 and 646 of power modules 608, 610 and 612, respectively.

During normal operation, cooler material 650 is injected into inlet port 620. Cooler material 650 circulates through cooling channels 614, 616 and 618 and exits cooling pipes 648 via output port 622. As cooler material 650 circulates through cooling channels 614, 616 and 618, cooler material 650 removes heat from respective top and bottom surfaces of respective DSC power modules 602, 604, 606, 608, 610, and 612.

In some embodiments, cooler material 650 may be in liquid form. For example, cooler material 650 may comprise a mixture of water and ethylene glycol. Cooler material 650 may also include antifreeze and additives for corrosion protection, such as BASF Gylsantin G30. Other liquids may also be used. In other embodiments, cooler material 650 may be in a gas form. For example, the cooler material may comprise chlorodifluoromethane (R-22), R-410a or other gas.

Cooling pipes 648 may comprise a material that is flexible. In such cases, cooling channels 614, 616, and 618 may contact respective top and bottom surfaces of DSC power modules 602, 604, 606, 608, 610, and 612 as a result of mechanical stress, such as, for example, by applying a compressing force between a top surface of cooling channel 614 and a bottom surface of cooling channel 618. In some embodiments, thermal grease may be used to thermally interface cooling channels 614, 616, and 618 with top and bottom surfaces of DSC power modules 602, 604, 606, 608, 610, and 612. Other ways to contact cooling channels 614, 616, and 618 with respective top and bottom surfaces of DSC power modules 602, 604, 606, 608, 610, and 612 may be used. Other embodiments may be directly cooled with a sealing and turbulating structure similar to PinFin or Shower Power cooling concepts.

Figure 7:
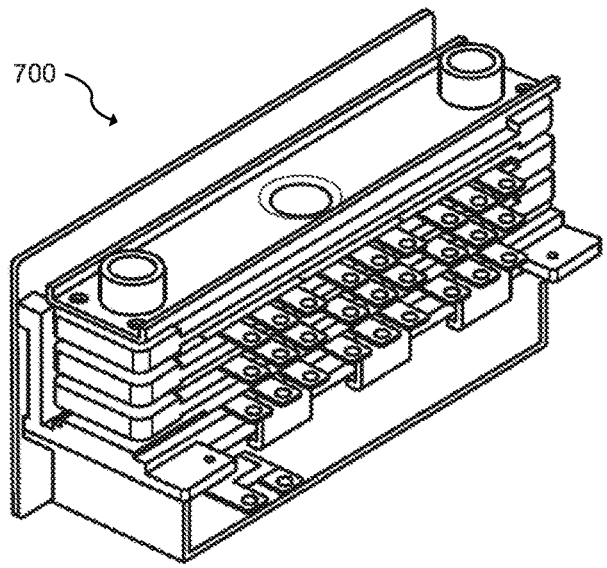
FIG. 7 shows a perspective view of a three-phase inverter system having a three parallel half-bridge inverter configuration, according to an embodiment of the present invention.

Using three half-bridges in parallel, four half-bridges in parallel or more for each of the phases of a three-phase inverter power system is also possible. For example, FIG. 7 shows a perspective view of exemplary three-phase inverter system 700 having a three parallel half-bridge inverter configuration, according to an embodiment of the present invention.

A partial or total blockage of one or more of the cooling channels of an inverter system, such as described in FIG. 6A, may develop. A total blockage refers to a blockage that prevents cooler material 650 from flowing through any of the cooling pipes. A partial blockage refers to a blockage that reduces or prevents the flow of cooler material 650 through one or more cooling pipes without preventing the flow of cooler material 650 through all of the cooling pipes. In other words, during a partial blockage, at least some cooler material 650 enters via inlet port 620 and exits via outlet port 622. If a partial or total blockage develops, some or all of the power modules may exhibit a degraded thermal dissipation profile. The inverter system may operate properly during a low power consumption mode even in the presence of a partial or total blockage of the cooling pipes because heat dissipation of the inverter system may be relatively low during a low power consumption mode. As power consumption of the inverter system increases, the partial or total blockage may cause an increase in temperature in one or more of the power modules, which may cause a malfunction of the system as well as permanent damage, in some cases.

Figure 8:
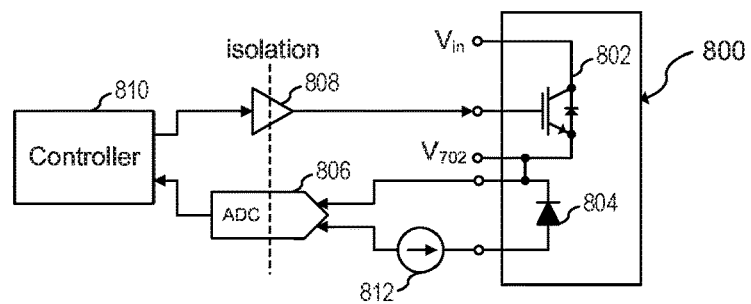
FIG. 8 shows a schematic diagram of a power module with an integrated temperature sensor, according to an embodiment of the present invention.

A way to detect a partial or total blockage of the cooling pipes is by monitoring the absolute temperature of the power modules. In some embodiments, each power module has an integrated temperature sensor. For example, FIG. 8 shows a schematic diagram of power module 800 with an integrated temperature sensor, according to an embodiment of the present invention. Power module 800 includes power transistor 802 and diode 804 for temperature measurements.

During normal operation, diode 804 may be used to monitor temperature of power transistor 802 in any way known in the art. For example, it is known that the voltage across a pn junction varies based on the temperature when a constant current is injected into the pn junction. Using this principle, the temperature of diode 804 may be obtained by measuring the voltage across diode 804 during injection of a known current, such as, for example, 1 mA. By placing diode 804 near the hot-spot of power transistor 802 (e.g., in the same substrate, near the center of power transistor 802), the temperature of power transistor 802 may be determined by determining the temperature of diode 804. The voltage across diode 804 may be processed, for example, by ADC 806. Other methods to measure the temperature of power transistor 702 may be used. For example, thermistor technologies such as negative temperature coefficient (NTC) thermistors and positive temperature coefficient (PTC) resistors may also be used.

Since in some embodiments the voltages of input $V_{in}$ and node $V_{702}$ may be in the hundreds of volts and controller 810 may operate in a low voltage domain, controller 810 may be electrically isolated from transistor 802 and diode 804, in some embodiments. For example, ADC 806 may be an isolated ADC. Other isolation implementations may be used.

A power system, such as three-phase inverter power system 600, as shown in FIGS. 6A and 6B, may monitor the absolute temperature of some or all of the power modules to determine whether a blockage exist. For example, in some embodiments the absolute temperature of some or all of the power modules is monitored and when one of the power modules has a temperature above a fault threshold, the driver and/or the controller operates the power modules in a low power mode, or disables the power modules. Some embodiments may generate a fault flag when the temperature is above the fault thresholds. Some embodiments generate the fault flag as well as disabling or operating the power modules in low power mode.

It is also possible to have more than one temperature threshold. For example, a warning threshold may be set at a temperature below the fault threshold. When the temperature of one or more power modules is above the warning threshold, a warning flag may be set. Some embodiments may operate the driver in a low-power mode (or limp home mode) when the temperature is above the warning threshold and below the fault flat, and may disable the driver when the temperature of the power modules is above the fault flag.

In an embodiment of the present invention, the difference in temperature between two DSC power modules in a DSC power module system may be used to determine whether a partial or total blockage of the cooling pipes exists. Once a partial or total blockage is detected, a controller disables the DSC power module system or operates the DSC power module system in low power mode. The controller may also alert an external user of the partial or total blockage.

In some embodiments, a partial blockage is detected by monitoring only a subset (e.g., two) of adjacent DSC power modules in each stack of power modules, where a first subset of (e.g., two) adjacent DSC power modules in a first stack and a second subset of (e.g., two) adjacent DSC power modules in a second stack are shifted with respect to each other. In other embodiments (e.g., see the embodiment of FIG. 19), partial blockage is detected by monitoring a single DSC power module per stack, with only a subset of stacks being monitored.

Figure 9A:
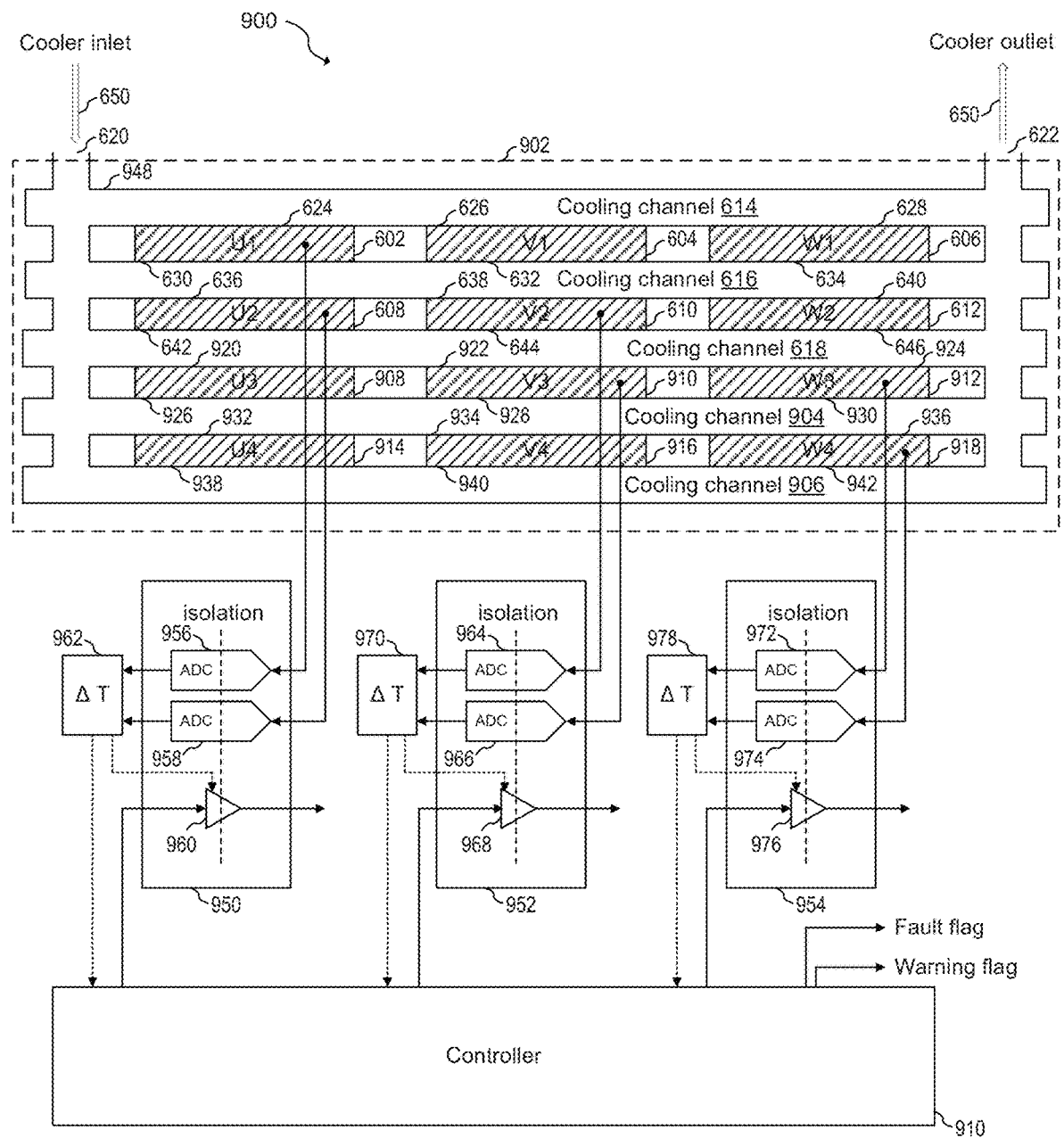
FIG. 9A shows a power module system having a three-phase inverter system with a four parallel half-bridge inverter configuration, according to an embodiment of the present invention.

FIG. 9A shows power module system 900, according to an embodiment of the present invention. In particular, FIG. 9A shows a cross-sectional view of three-phase inverter system 902 having a four parallel half-bridge inverter configuration, and a schematic diagram of circuitry associated with driving three-phase inverter system 902. Power module system 900 includes three-phase inverter system 902, integrated circuits (ICs) 950, 952, and 954, differential temperature sensing units 962, 970, and 978, and controller 910. IC 950 includes gate driver 960 and ADCs 956 and 958. IC 952 includes gate driver 968 and ADCs 964 and 966. IC 954 includes gate driver 976 and ADCs 972 and 974. Three-phase inverter system 902 includes DSC power modules 602, 604, 606, 608, 610, 612, 908, 910, 912, 914, 916, and 918, each including a respective half-bridge.

During normal operation, the half-bridges of DSC power modules 602, 608, 908, and 914 drive the U phase of a three-phase load coupled to three-phase inverter system 902, the half-bridges of DSC power modules 604, 610, 910, and 916 drive the V phase of the three-phase load, and the half-bridges of DSC power modules 606, 612, 912, and 918 drive the W phase of the three-phase load. As three-phase inverter system 902 drives the three-phase load, heat is generated by DSC power modules 602, 604, 606, 608, 610, 612, 908, 910, 912, 914, 916, and 918. Cooler material 650 circulates through cooling pipes 948 and removes heat from respective top and bottom surfaces of DSC power modules 602, 604, 606, 608, 610, 612, 908, 910, 912, 914, 916. In particular, cooler material 650 circulating through cooling channel 614 removes heat from top surfaces 624, 626, and 628 of DSC power modules 602, 604, and 606; cooler material 650 circulating through cooling channel 616 removes heat from top surfaces 636, 638 and 640 of DSC power modules 608, 610, and 612 and from bottom surfaces 630, 632, and 634 of DSC power modules 602, 604, and 608; cooler material 650 circulating through cooling channel 618 removes heat from top surfaces 920, 922 and 924 of DSC power modules 908, 910, and 912 and from bottom surfaces 642, 644, and 646 of DSC power modules 608, 610, and 612; cooler material 650 circulating through cooling channel 904 removes heat from top surfaces 932, 934 and 936 of DSC power modules 914, 916, and 918 and from bottom surfaces 926, 928, and 930 of DSC power modules 908, 910, and 912; and cooler material 650 circulating through cooling channel 906 removes heat from bottom surfaces 938, 940, and 942 of DSC power modules 914, 916, and 918.

Since each DSC power module of a respective phase operates in parallel, the amount of current flowing through each DSC power module is substantially similar. The heat dissipated by each DSC power module of a respective phase, therefore, is also substantially similar. During normal operation, therefore, the difference between the temperatures of DSC power modules of a respective phase is substantially small or zero. In some embodiments, the difference between the temperatures of any DSC power module with respect to any other DSC power module is substantially small or zero.

During normal operation, ADC 956 monitors the temperature of DSC power module 602, and ADC 958 monitors the temperature of DSC power module 608. Differential temperature sensing unit 962 determines a difference between the temperature of DSC power module 602 and 608 and provides such difference to controller 910. Additionally, ADC 964 monitors the temperature of DSC power module 610, ADC 966 monitors the temperature of DSC power module 910, ADC 972 monitors the temperature of DSC power module 912, and ADC 974 monitors the temperature of DSC power module 918. Differential temperature sensing units 970 and 978 determine respective differences between the temperature of DSC power module 610 and 910, and 912 and 918, respectively, and provide respective differences to controller 910. As shown in the specific embodiment of FIG. 9A, each differential temperature sensing unit only monitors two adjacent DSC power modules per stack. Each pair of monitored adjacent DSC power modules in each stack is shifted with respect to another pair of monitored adjacent DSC power modules in another stack. In some embodiments, more than two DSC power modules may be monitored per stack.

When the respective differences provided by differential temperature sensing units 962, 970, and 978 are all below a predetermine threshold, controller 910 continues to drive gate drivers 960, 968 and 976 normally. Since there may be noise associated with the temperature measurements, and some of the DSC power modules may run slightly hotter than others due to several factors, such as load imbalances, for example, the predetermine threshold for the difference may be selected, for example, between 8 and 12° K. As another non-limiting example, the threshold for the difference may be selected between 15 and 25° K. Higher or lower thresholds may be used.

When cooling pipes are partially obstructed, one or more cooling channels may have reduced or no flow of cooler material 650. When cooler material 650 is not flowing through a particular cooling channel or when cooler material 650 is flowing through the particular cooling channel at a reduced rate, the respective top and bottom surfaces of the respective DSC power modules exposed to the obstructed cooling channels may dissipate less heat than respective top and bottom surfaces exposed to unobstructed cooling channels. As a result, a first DSC power module having both surfaces exposed to unobstructed cooling channels will run cooler than a second DSC power module having at least one surface exposed to an obstructed channel, and a difference in temperature between the first and second DSC power modules may develop. A respective differential temperature sensing unit may provide, as a result, a temperature difference that is higher than the predetermined threshold. When one or more temperature differences provided by differential temperature sensing unit 962, 970 or 978 exceed the predetermine threshold, controller 910 may disable all gate drivers 960, 968, and 976, in some embodiments. A fault flag may also be issued. In some embodiments, controller 910 may driver gate drivers 960, 968, and 976 in a low power mode.

In some embodiments, differential sensing unit 962, 970, and 978 may disable the respective gate driver circuit directly.

In some embodiments, more than one temperature difference threshold is used. For example, a first threshold may be used as a warning threshold and a second threshold may be used as a fault threshold. When the warning threshold is exceed, controller 910 may issue a warning flag while continuing to operate gate drivers 960, 968 and 976 normally. In some embodiments, controller 910 may operate gate drivers 960, 968 and 976 in such a way that the DSC power modules dissipate low power when the warning threshold is exceeded.

When the fault threshold is exceeded, controller 910 may issue a fault flag. In some embodiments, controller 910 may disable gate drivers 960, 968 and 976 when the fault threshold is exceeded. In some embodiments, controller 910 may operate gate drivers 960, 968 and 976 in such a way that the DSC power modules dissipate low power mode when the fault threshold is exceeded.

In some embodiments, the fault threshold has a higher temperature than the warning threshold. For example, the warning threshold may be between 8 and 12° K, such as 10° K, and the fault threshold may be between 18 and 22° K, or 20° K. Higher or lower thresholds may also be used. It is understood that the warning and fault threshold values may vary depending on the particular implementation. As another non-limiting example, in some embodiments, the system may operate normally when the monitored temperature difference between two DSC power modules is below 20° K (e.g., warning threshold at 20° K). Such system may operate using power derating when the monitored temperature difference between two DSC power modules is between 20° K and 30° K. Such system may disable the power modules when the monitored temperature difference between two DSC power modules is equal to or higher than 30° K (e.g., fault threshold at 30° K).

Three-phase inverter system 902 may be a four parallel system, as shown in FIG. 9A. Some embodiments may implement three-phase inverter system 902 with two, three, five or more parallel configuration.

ADCs 956, 958, 964, 966, 972, and 974 may be isolated ADC's. In some embodiments, ADCs 956 and 958, 964 and 966, and 972 and 974, may be combined, respectively, into three ADCs by using a multiplexer (MUX), such as a two-channel MUX between the inputs of the respective ADCs and the respective ADC cores, where the ADC cores are configured to perform the analog-to-digital conversion.

Differential temperature sensing units 962, 970 and 978 may be implemented with window comparators that compare the signals from respective ADCs. The comparison threshold may be programmable, in some embodiments.

In some embodiments, the difference in temperature may be determined digitally. In other embodiments, the difference in temperature may be determined with analog circuits, such as an analog window comparator circuit. In such cases, the use of an ADC may be avoided. Appropriate modifications may be made to the circuit.

Gate drivers 960, 968, and 976 may be isolated gate drivers configured to driver phases U, V and W, respectively. Gate drivers 960, 968, and 976 may each be implemented with two gate drivers, one for driving the high-side transistors of the respective half-bridge and one for driving the low-side transistors of the respective phases, where all the high-side transistors of the respective phases are driven in parallel by the same high-side gate driver, and where all the low-side transistors of the respective phases are driven in parallel by the same low-side gate driver.

ICs 950, 952 and 954 may each be implemented in a respective monolithic semiconductor substrate. Each of ICs 950, 952, and 954 may include a gate driver and an ADC unit in the respective monolithic semiconductor substrate. The current source for providing current to the respective temperature sensor, such as current source 812 for diode 804, may also be integrated in ICs 950, 952, and 954, respectively. In some embodiments, each of ICs 950, 952, and 954 may integrate a differential temperature sensing unit in the same respective monolithic semiconductor substrate. In other embodiments, the ADC units and the gate drivers may be implemented discretely.

Controller 910 may be implemented as a discrete controller. In some embodiments, controller 910 may be integrated in a monolithic semiconductor substrate together with temperature sensing units 962, 970, and 978. Controller 910 may also integrate gate drivers 960, 952 and 954 and ADCs 956, 958, 964, 966, 972, and 974 in the same monolithic semiconductor substrate while having an isolation circuit external to the monolithic substrate.

DSC power modules 602, 604, 606, 608, 610, 612, 908, 910, 912, 914, 916, and 918 may each include an internal temperature sensor, such as a diode. Other temperature sensors, such as negative temperature coefficient (NTC) thermistors, positive temperature coefficient (PTC) resistors, and others may be used.

In some embodiments, respective top and bottom surfaces of respective DSC power modules are in direct contact with respective cooling channels. In other embodiments a thermal interface material (TIM), such as thermal grease, may be used to coupled respective top and bottom surfaces of respective DSC power modules to respective cooling channels. Some embodiments may use PinFin or other turbulating structures for direct cooling.

Figure 9B:
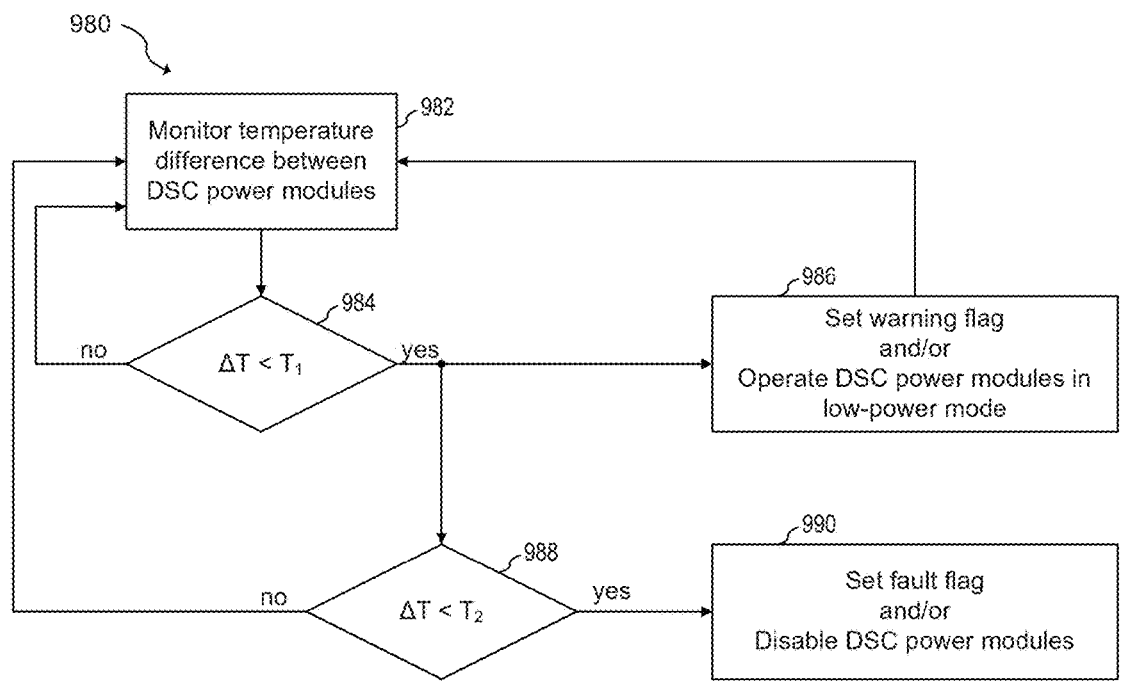
FIG. 9B shows a flow chart of a method of operating a DSC power system having a stack configuration, according to an embodiment of the present invention.

FIG. 9B shows a flow chart of embodiment method 980 of operating a DSC power system having a stack configuration, according to an embodiment of the present invention. Method 980 may be implemented with power module system 900. Alternatively, method 980 may be implemented in other power module system implementations. The discussion that follows assumes that power module system 900, as shown in FIG. 9A, implements method 980.

During step 982, a plurality of temperature monitoring units monitor the respective difference in temperature between two stacked DSC power modules per stack (such as the DSC power module stack corresponding to either the U phase, V phase, or W phase), where each power module of the two stacked DSC power modules has at least one surface in contact with the same cooling channel and at least one surface in contact with a different cooling channel. In other words, a difference in temperature is monitored between two DSC power modules of a stack of DSC power modules that are arranged adjacent to each other. For each stack of DSC power modules, the difference in temperature between the two adjacent DSC power modules is compared against a temperature threshold $T_1$ during step 984. If the difference in temperature is below threshold $T_1$, the temperature monitor units continue to monitor the differences in temperature. If the difference in temperature is above threshold $T_1$, a controller, such as controller 910, may either set a warning flag, disable or operate the DSC power modules in a low-power mode, or a combination thereof. Steps 988 and 990 are optional.

During step 988, the difference in temperature between DSC power modules is compared against a temperature threshold $T_2$. If the difference in temperature is below threshold $T_2$, the temperature monitor units continue to monitor the differences in temperature. If the difference in temperature is above threshold $T_2$, the controller may either set a fault flag, disable or operate the DSC power modules in a second low-power mode, or a combination thereof. If the second low-power mode is used during step 990, the second low-power mode may be lower power than the low-power mode used in step 986, if any.

Advantages of some embodiments include monitoring only a subset of the DSC power modules while obtaining early warning of a partial or total blockage in the cooling pipes. In some embodiments, the temperature is monitored only in DSC power modules of a stack of DSC power modules that are arranged adjacent to each other. By monitoring only a subset of the DSC power modules, the implementation complexity of the solution may be reduced. For example, less wiring and signal processing power may be used. These advantages may increase as the number of DSC power modules connected in parallel increases. A lower cost system may also result.

Additional advantage includes scalability and modularity of the system. For example, three chips, each including a gate driver and an ADC unit, may be used to drive either a two, three, or four three-phase parallel system without having to incorporate additional ADCs or gate drivers as the number of paralleled DSC power modules is increased. In some embodiments, each of the three chips is identical to each other. By using identical chips for driving different configurations of three-phase paralleled systems, complexity may be reduced. In some embodiments, if a system having five paralleled DSC power modules or more is used, the addition of an ADC unit (or ADC channel, if a MUX is used) per additional parallel DSC power module may be sufficient.

Figure 9C:
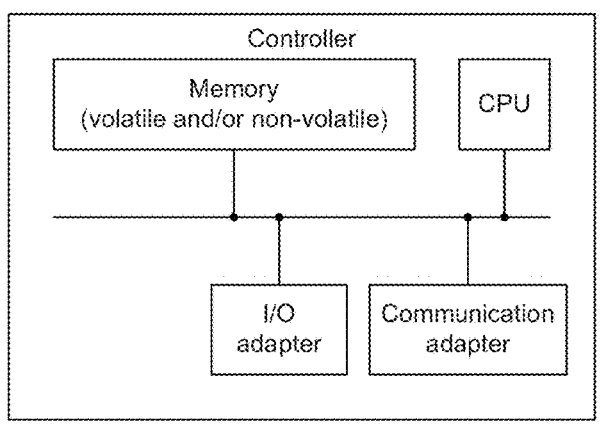
FIGS. 9C and 9D illustrate non-limiting examples of possible implementations of a controller, according to an embodiment of the present invention.
Figure 9D:
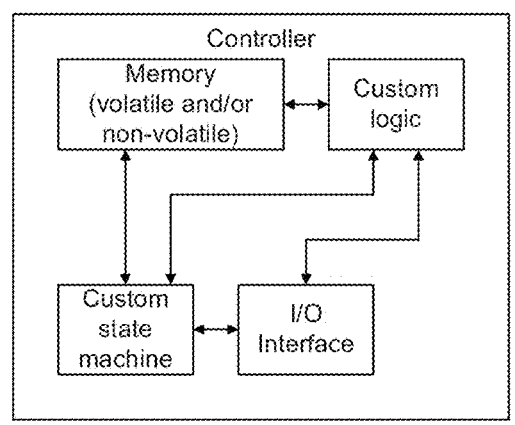

Method 980 may be implemented with a controller, such as controller 910. The controller may be implemented in any way known in the art. For example, the controller, such as controller 910, may be implemented with a general purpose (e.g., generic) microcontroller or microprocessor capable of executing code (e.g., software), which may be stored, for example, in non-transitory computer readable medium. The controller may also be implemented with custom digital logic, such as a custom state machine, for example. The controller may include, for example, a central processing unit (CPU), memory, which may include volatile and non-volatile memory, and a mass storage device connected to a bus. The controller may also include I/O adapters and/or interfaces, which may include digital and/or analog I/O pins, as well as a network interface capable of communicating with external users via wired or wireless communication. FIGS. 9C and 9D illustrate non-limiting examples of possible implementations of a controller, according to an embodiment of the present invention.

FIGS. 10-19 show examples of different partial and total obstructions of cooling pipes in different DSC power module system configurations, according to embodiments of the present invention. FIGS. 10-15 show a DSC power module system having four DSC power modules in parallel per phase, according to embodiments of the present invention.

Figure 10:
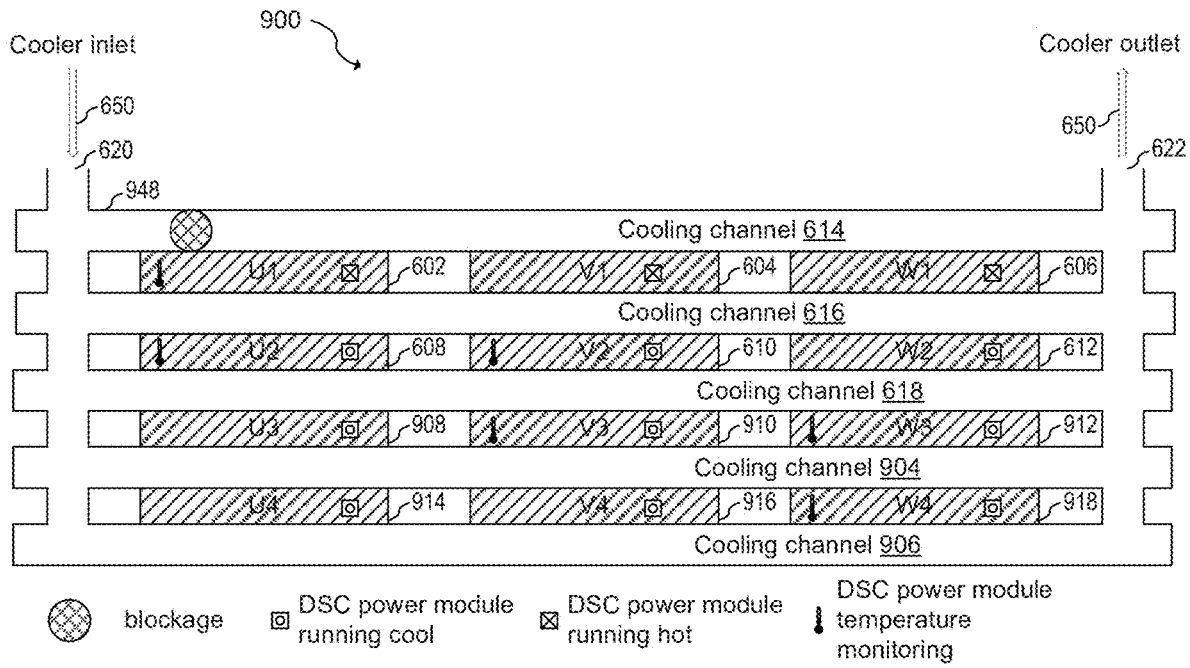
FIGS. 10-19 show examples of different partial and total obstructions of cooling pipes in different DSC power module system configurations, according to embodiments of the present invention.

FIG. 10 shows a first example of a partial blockage and blockage detection of power module system 900, according to an embodiment of the present invention. As shown in FIG. 10, when cooling channel 614 is obstructed, DSC power modules 602, 604 and 606 run hotter than DSC power modules 608, 610, 612, 908, 910, 912, 914, 916, and 918. The partial blockage of cooling channel 614, therefore, may be detected by monitoring the difference in temperature between DSC power modules 602 and 608.

As shown in FIG. 10, it is possible to detect a partial blockage of cooling channel 614 by monitoring a difference in temperature between a single pair of DSC power modules (e.g., DSC power modules 602 and 608). Alternatively, a different pair of DSC power modules could have been monitored (e.g., DSC power modules 604 and 610).

Figure 11:
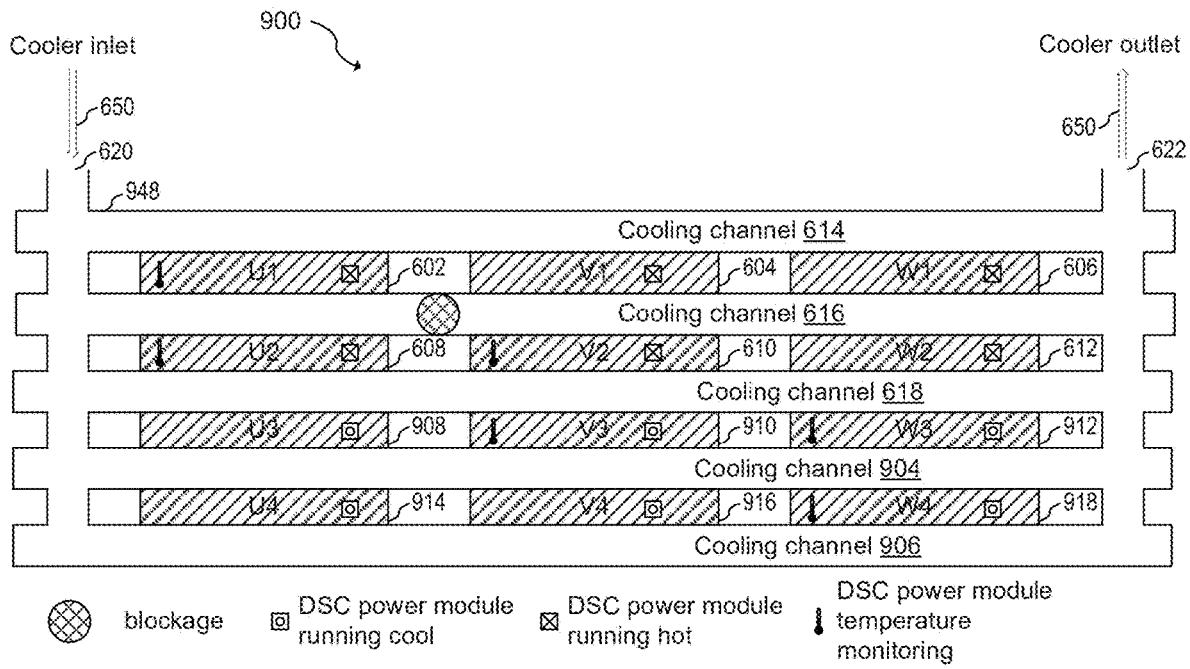

FIG. 11 shows a second example of a partial blockage and blockage detection of power module system 900, according to an embodiment of the present invention. As shown in FIG. 11, when cooling channel 616 is obstructed, DSC power modules 602, 604, 606, 608, 610, and 612 run hotter than DSC power modules 908, 910, 912, 914, 916, and 918. The partial blockage of cooling channel 616, therefore, may be detected by monitoring the difference in temperature between DSC power modules 610 and 910.

As shown in FIG. 11, it is possible to detect a partial blockage of cooling channel 616 by monitoring a difference in temperature between a single pair of DSC power modules (e.g., DSC power modules 610 and 910). Alternatively, a different pair of DSC power modules could have been monitored (e.g., DSC power modules 612 and 912).

Figure 12:
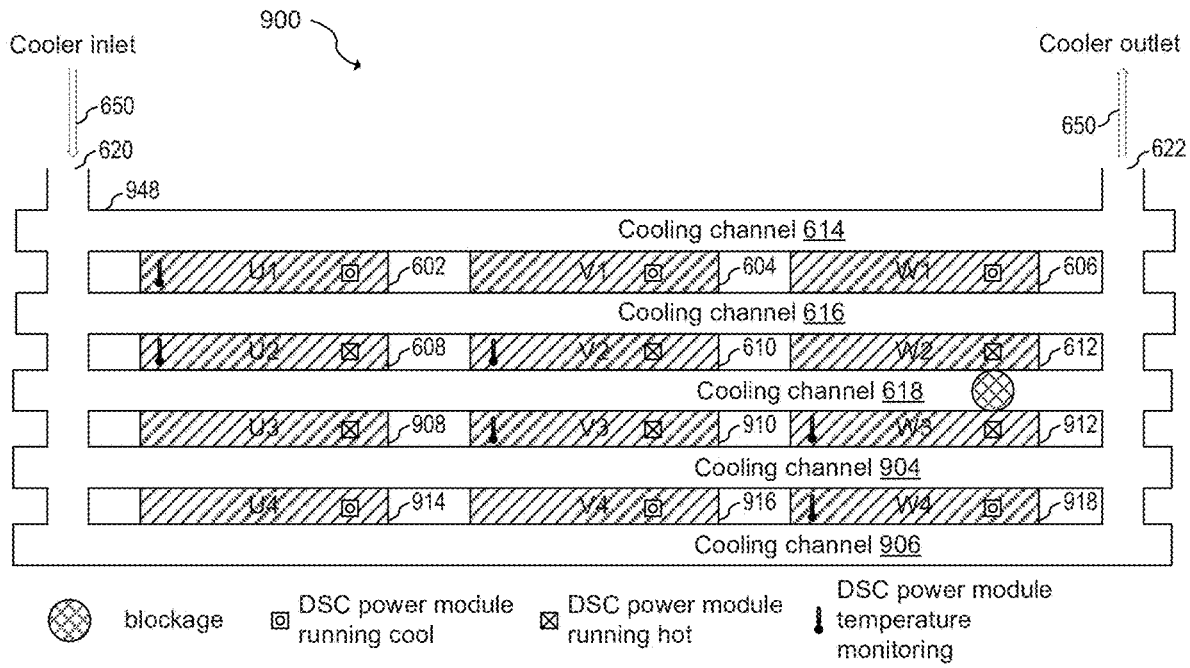

FIG. 12 shows a third example of a partial blockage and blockage detection of power module system 900, according to an embodiment of the present invention. As shown in FIG. 12, when cooling channel 618 is obstructed, DSC power modules 608, 610, 612, 908, 910, and 912 run hotter than DSC power modules 602, 604, 606, 914, 916, and 918. The partial blockage of cooling channel 618, therefore, may be detected by monitoring the difference in temperature between DSC power modules 602 and 608, and/or between DSC power modules 912 and 918.

As shown in FIG. 12, it is possible to detect a partial blockage of cooling channel 618 by monitoring a difference in temperature between a single pair of DSC power modules (e.g., DSC power modules 602 and 608 or 912 and 918). Alternatively, a different pair of DSC power modules could have been monitored (e.g., DSC power modules 910 and 916).

Figure 13:
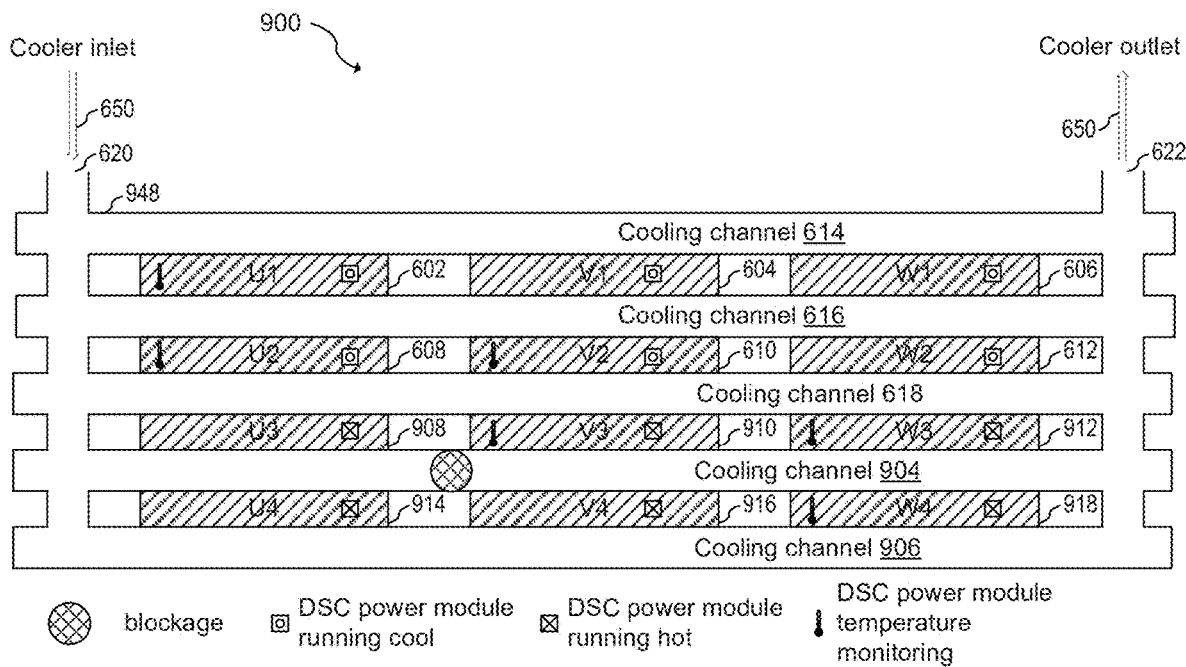

FIG. 13 shows a fourth example of a partial blockage and blockage detection of power module system 900, according to an embodiment of the present invention. As shown in FIG. 13, when cooling channel 904 is obstructed, DSC power modules 602, 604, 606, 608, 610, and 612 run cooler than DSC power modules 908, 910, 912, 914, 916, and 918. The partial blockage of cooling channel 904, therefore, may be detected by monitoring the difference in temperature between DSC power modules 610 and 910.

As shown in FIG. 13, it is possible to detect a partial blockage of cooling channel 904 by monitoring a difference in temperature between a single pair of DSC power modules (e.g., DSC power modules 610 and 910). Alternatively, a different pair of DSC power modules could have been monitored (e.g., DSC power modules 612 and 912).

Figure 14:
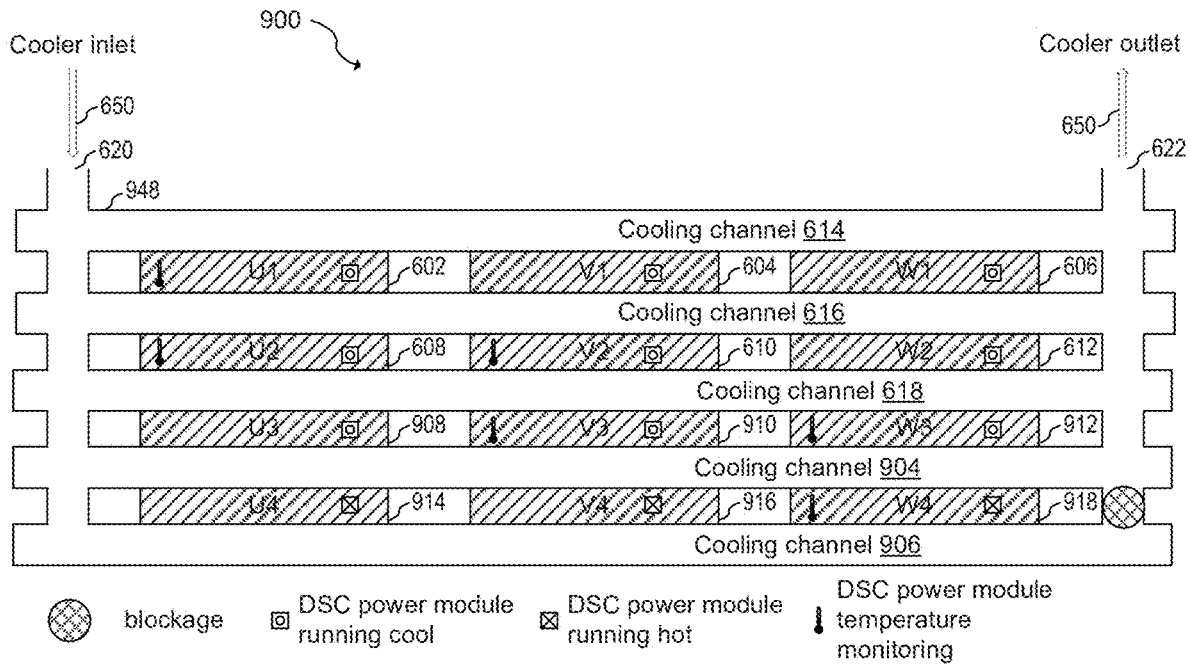

FIG. 14 shows a fifth example of a partial blockage and blockage detection of power module system 900, according to an embodiment of the present invention. As shown in FIG. 14, when cooling channel 906 is obstructed, DSC power modules 602, 604, 606, 608, 610, 612, 908, 910 and 912 run cooler than DSC power modules 914, 916, and 918. The partial blockage of cooling channel 906, therefore, may be detected by monitoring the difference in temperature between DSC power modules 912 and 918.

As shown in FIG. 14, it is possible to detect a partial blockage of cooling channel 906 by monitoring a difference in temperature between a single pair of DSC power modules (e.g., DSC power modules 912 and 918). Alternatively, a different pair of DSC power modules could have been monitored (e.g., DSC power modules 910 and 916).

Figure 15:
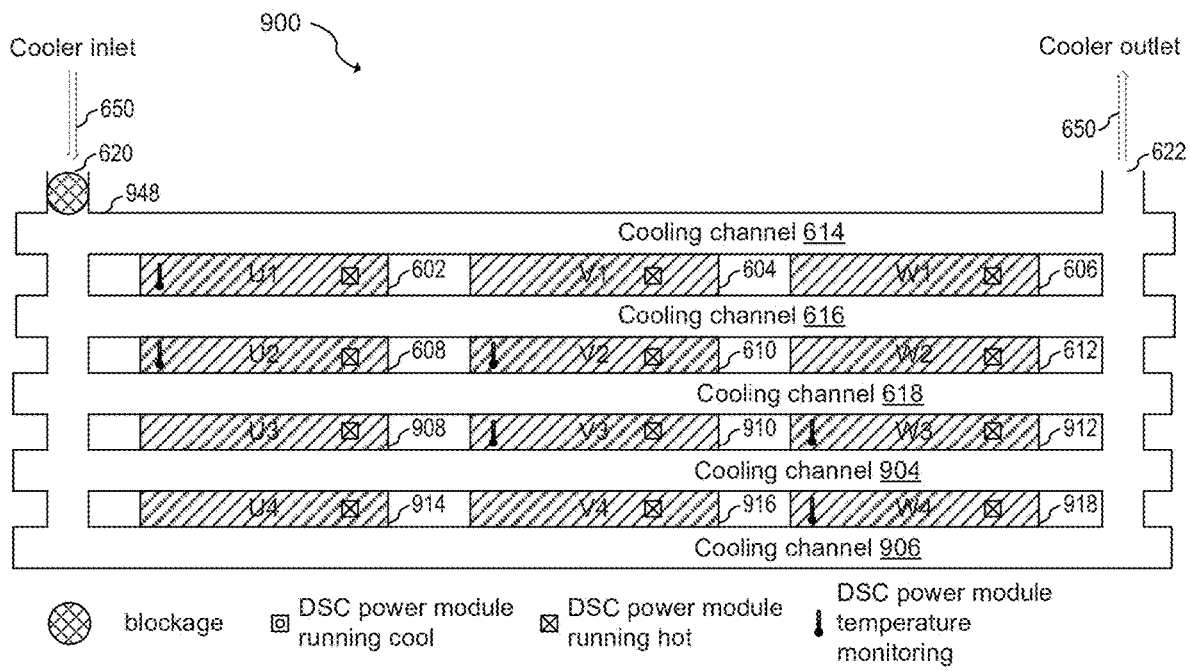

FIG. 15 shows an example of a total blockage and blockage detection of power module system 900, according to an embodiment of the present invention. As shown in FIG. 15, during a total blockage, all DSC power modules run hot. The total blockage may be detected by monitoring the absolute temperature of any of the DSC power modules, such as DSC power modules 602, 608, 610, 910, 912, or 918. In some embodiments, the average of the absolute temperature of all monitored DSC power modules may be used to determine a total blockage and/or when the flow rate of the cooler material 650 is too low and/or when the total power dissipation of the entire power system is too high with respect to the actual cooling.

As shown in FIGS. 10-14, by relying on differential temperature monitoring rather than an absolute temperature monitoring for detection of partial blockage, early detection is possible (since the differential threshold may be set lower than the absolute threshold). As shown in FIG. 15, since a total blockage may be detected by monitoring the absolute temperature of any of the DSC power modules, monitoring more than two DSC power modules per stack can be avoided. By monitoring only a subset of the DSC power modules, the implementation complexity of the solution may be reduced and less wiring and signal processing power may be used.

Figure 16:
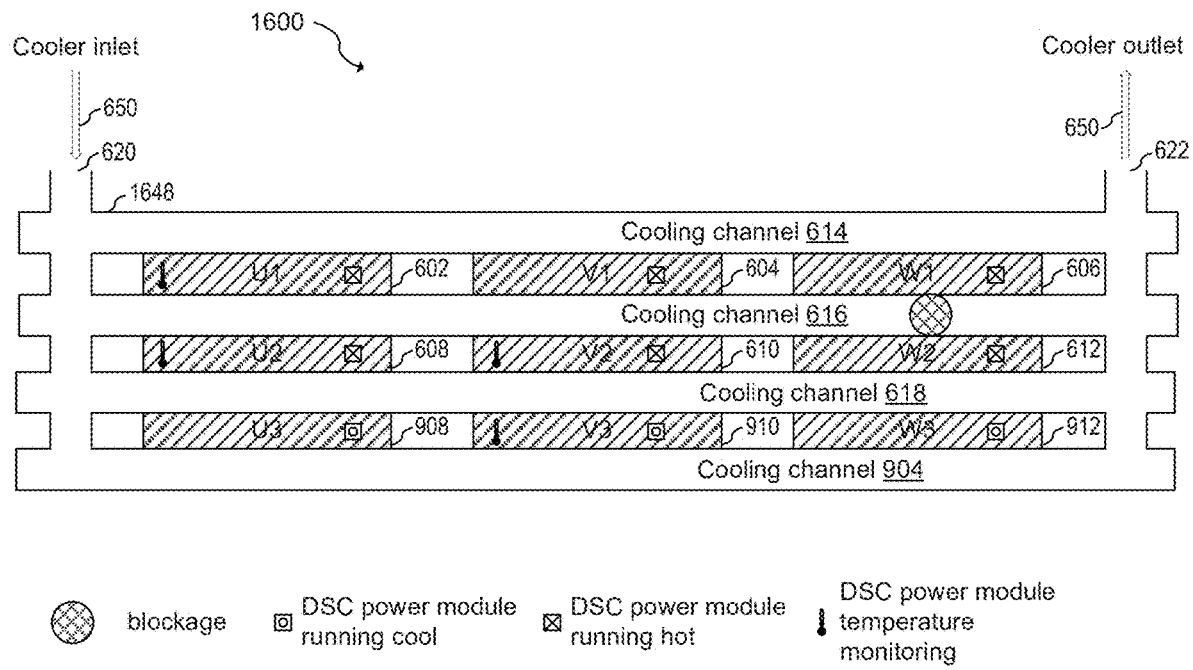

FIG. 16 shows an example of a partial blockage and blockage detection of power module system 1600, according to an embodiment of the present invention. Power module system 1600 has three DSC power modules in parallel per phase. As shown in FIG. 16, when cooling channel 616 is obstructed, DSC power modules 602, 604, 606, 608, 610, and 612 run hotter than DSC power modules 908, 910, and 912. The partial blockage of cooling channel 616, therefore, may be detected by monitoring the difference in temperature between DSC power modules 610 and 910.

Figure 17:
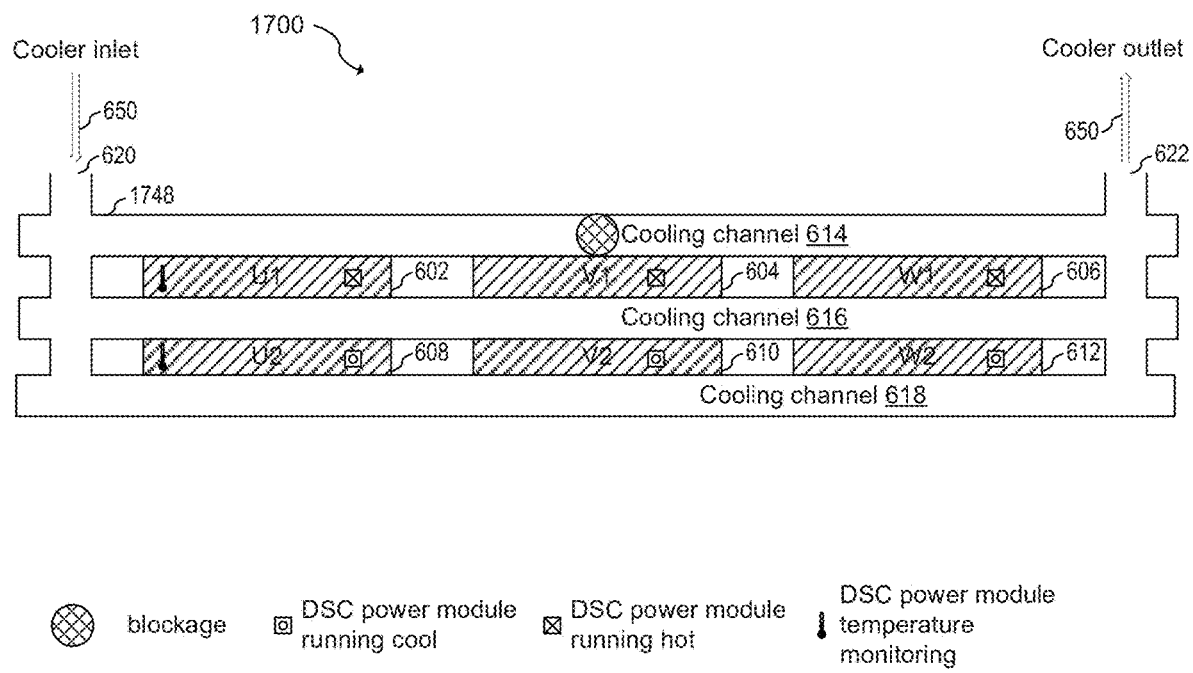
Figure 18:
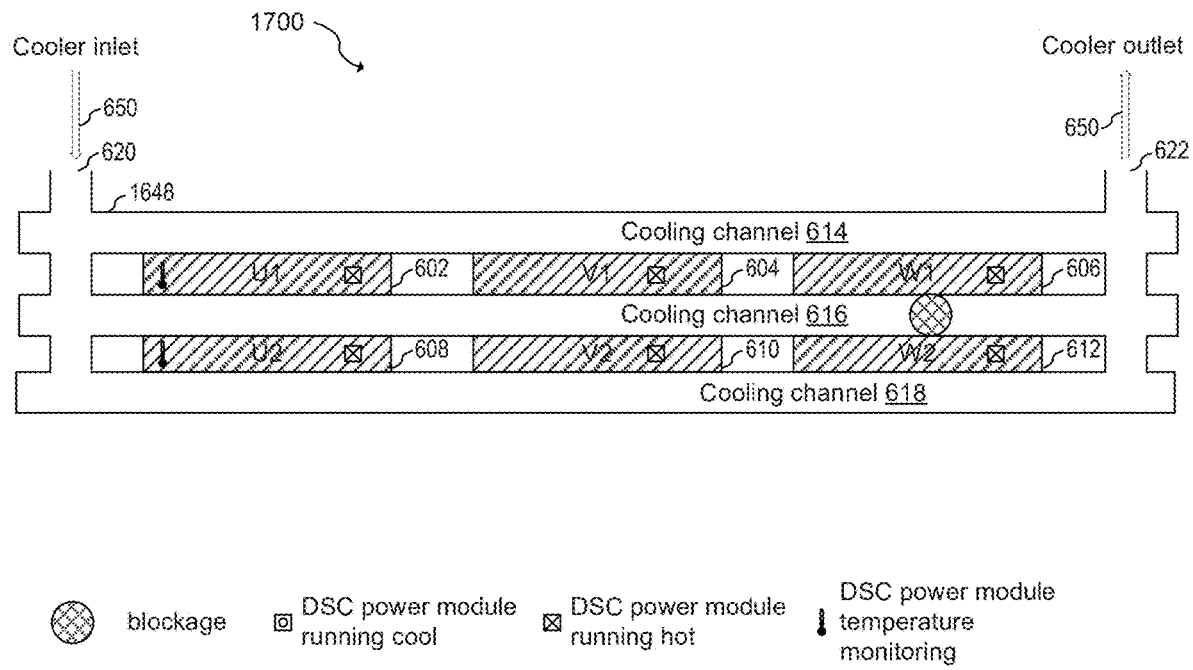
Figure 19:
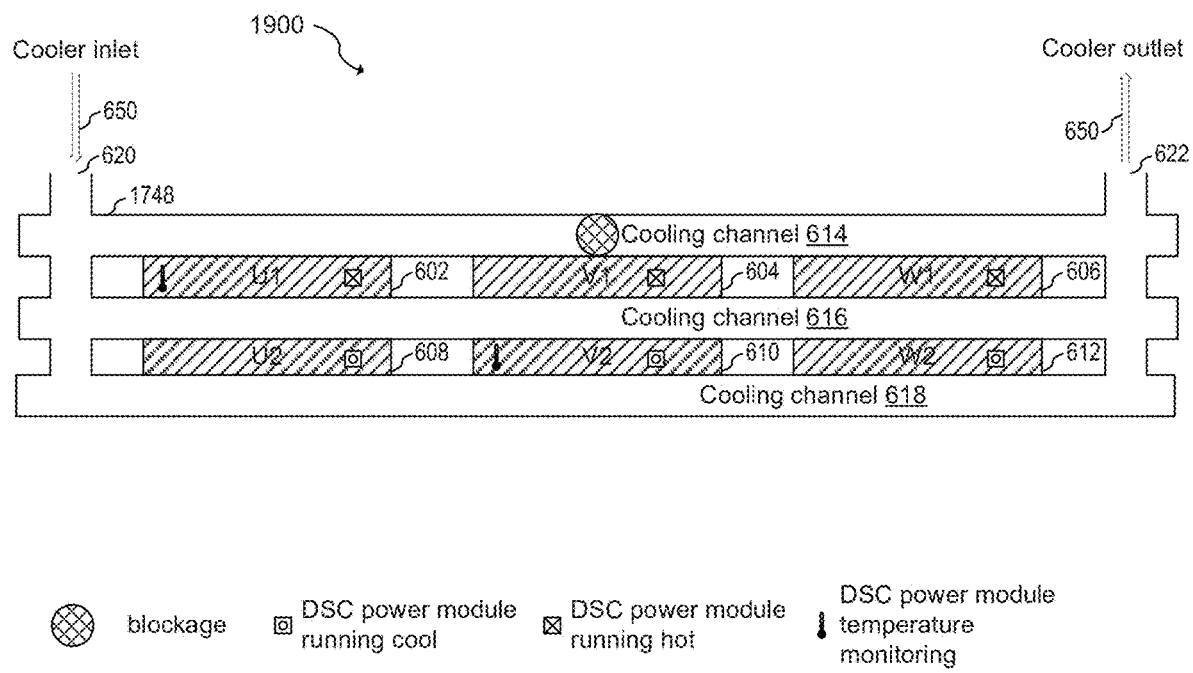

FIGS. 17-19 show DSC power module systems having two DSC power modules in parallel per phase, according to embodiments of the present invention.

FIG. 17 shows a first example of a partial blockage and blockage detection of power module system 1700, according to an embodiment of the present invention. As shown in FIG. 17, when cooling channel 614 is obstructed, DSC power modules 602, 604, 606 run hotter than DSC power modules 608, 610, and 612. The partial blockage of cooling channel 614, therefore, may be detected by monitoring the difference in temperature between DSC power modules 602 and 608.

FIG. 18 shows a second example of a partial blockage and blockage detection of power module system 1700, according to an embodiment of the present invention. As shown in FIG. 18, when cooling channel 616 is obstructed, DSC power modules 602, 604, 606, 608, 610, and 612 run hot. The partial blockage of cooling channel 614, therefore, may be detected by monitoring the absolute temperature of any of the DSC power modules, such as DSC power modules 602, or 608. In some embodiments, the average of the absolute temperature of all monitored DSC power modules may be used to determine the blockage and/or when the flow rate of the cooler material 650 is too low and/or when the total power dissipation of the entire power system is too high with respect to the actual cooling.

FIG. 19 shows a first example of a partial blockage and blockage detection of power module system 1900, according to an embodiment of the present invention. As shown in FIG. 19, when cooling channel 614 is obstructed, DSC power modules 602, 604, 606 run hotter than DSC power modules 608, 610, and 612. The partial blockage of cooling channel 614, therefore, may be detected by monitoring the difference in temperature between DSC power modules 602 and 610.

As shown in FIGS. 17 and 18, it is possible to detect a partial blockage by monitoring the temperature of DSC power modules of a single stack of DSC power modules. Since a total blockage may be detected by monitoring the absolute temperature of any of the DSC power modules in the system, it is possible to detect blockages and obtain early warning by monitoring DSC power modules in a single stack of DSC power modules. As shown in FIG. 19, it is also possible to achieve the advantages described herein by monitoring a single DSC power module per stack.

Example embodiments of the present invention are summarized here. Other embodiments can also be understood from the entirety of the specification and the claims filed herein.

Example 1

A method including: monitoring a temperature difference between two double-side cooled (DSC) power modules of a plurality of DSC power modules arranged in stacks of DSC power modules, each DSC power module of the plurality of DSC power modules being thermally coupled with one or more cooling channels of a plurality of cooling channels of a cooling pipe system, and the two DSC power modules being thermally coupled with a same cooling channel of the plurality of cooling channels; comparing the temperature difference with a first temperature threshold; detecting a cooling pipe system blockage when the temperature difference is above the first temperature threshold; and after detecting the cooling pipe system blockage, disabling gate driver circuits coupled to the plurality of DSC power modules or operating the DSC power modules in a low-power mode.

Example 2

The method of example 1, further including generating a fault flag after detecting the cooling pipe system blockage.

Example 3

The method of one of examples 1 or 2, further including monitoring absolute temperatures of one or more of DSC power modules of the plurality of DSC power modules, where detecting the cooling pipe system blockage includes detecting the cooling pipe system blockage when at least one absolute temperature of the one or more absolute temperatures is above a second temperature threshold.

Example 4

The method of one of examples 1 to 3, where the second temperature threshold is between 125° C. and 200° C.

Example 5

The method of one of examples 1 to 4, further including: monitoring absolute temperatures of one or more DSC power modules of the plurality of DSC power modules; averaging the monitored absolute temperatures to produce an average temperature; and comparing the average temperature with a second temperature threshold, where detecting the cooling pipe system blockage includes detecting the cooling pipe system blockage when the average temperature is above the second temperature threshold.

Example 6

The method of one of examples 1 to 5, further including: comparing the temperature difference with a third temperature threshold; and setting a warning flag when the temperature differences is above the third temperature threshold and below the first temperature threshold.

Example 7

The method of one of examples 1 to 6, where the first temperature threshold is between 15° K and 25° K and the third temperature threshold is between 8° K and 12° K.

Example 8

The method of one of examples 1 to 7, further including operating the DSC power modules in a low-power mode by turning on all low side switches of the DSC power modules and turning off all high side switches of the DSC power modules.

Example 9

The method of one of examples 1 to 8, where monitoring the temperature difference between the two DSC power modules includes monitoring the temperature difference between two adjacent DSC power modules of a first stack of the stacks of DSC power modules, the method further including: monitoring a second temperature difference between two adjacent DSC power modules of a second stack of the stacks of DSC power modules, where the two adjacent DSC power modules of the second stack are selected in the second stack such that they are shifted with respect to the two adjacent DSC power modules of the first stack along a stacking direction of the first and second stacks.

Example 10

A circuit including: a gate driver circuit configured to be coupled to a plurality of half-bridges, each half-bridge packaged in a double-side cooled (DSC) package; an analog-to-digital converter (ADC) circuit having a first input configured to be coupled to a first temperature sensor thermally coupled to a first half-bridge of the plurality of half-bridges and a second input configured to be coupled to a second temperature sensor thermally coupled to a second half-bridge of the plurality of half-bridges; and a controller configured to: determine a temperature difference based on input signals at the first and second inputs of the ADC circuit, and disable the gate driver circuit or activate a system safe state operation when the temperature difference is above a first temperature threshold.

Example 11

The circuit of example 10, where the gate driver circuit and the ADC circuit are disposed in a same monolithic semiconductor substrate.

Example 12

The circuit of one of examples 10 or 11, further including the plurality of half-bridges, where each half-bridge of the plurality of half-bridges has a temperature sensor, and where each half-bridge and the respective temperature sensor are disposed in a same monolithic semiconductor substrate.

Example 13

The circuit of one of examples 10 to 12, where each temperature sensor includes a diode, the circuit further including first and second current sources configured to be coupled to respective diodes of the first and second temperature sensors.

Example 14

The circuit of one of examples 10 to 13, where the plurality of half-bridges is arranged as a stack of a plurality of stacks, each stack includes a plurality of half-bridges, each half-bridge is packaged in a DSC package, each DSC package has a top surface and a bottom surface opposite the top surface, and each of the top and bottom surfaces of each DSC package is thermally coupled to a cooling channel of a cooling pipe system.

Example 15

The circuit of one of examples 10 to 14, where the gate driver circuit includes an isolated gate driver circuit, and the ADC circuit includes an isolated ADC circuit.

Example 16

The circuit of one of examples 10 to 15, where the ADC circuit includes a multiplexer coupled between the first and second inputs of the ADC circuit and an ADC core, where the ADC core is configured to perform analog-to-digital conversions.

Example 17

The circuit of one of examples 10 to 16, where the controller comprises a window comparator configured to compare a first temperature of the first temperature sensor and a second temperature of the second temperature sensor with the first temperature threshold.

Example 18

A system including: a plurality of stacks of double-side cooled (DSC) power modules, each DSC power module having a top surface and a bottom surface opposite the top surface; a cooling pipe system including a plurality of cooling channels, where the top and bottom surfaces of each DSC power module of each stack are thermally coupled with one or more cooling channels of the plurality of cooling channels; and a controller configured to: determine one or more temperature difference between two DSC power modules that are thermally coupled to a same cooling channel of the plurality of cooling channels, and detect a blockage of the cooling pipe system when at least one of the one or more temperature differences is above a first temperature threshold.

Example 19

The system of example 18, where determining one or more temperature difference between two DSC power modules includes: determining a first temperature difference between two adjacent DSC power modules of a first stack of the stacks of DSC power modules; and determining a second temperature difference between two adjacent DSC power modules of a second stack of the stacks of DSC power modules, where the two adjacent DSC power modules of the second stack are selected in the second stack such that they are shifted with respect to the two adjacent DSC power modules of the first stack along a stacking direction of the first and second stacks.

Example 20

The system of one of examples 18 or 19, where each of the plurality of cooling channels is thermally coupled with at least the top or the bottom surface of one of the plurality of DSC power modules of each stack.

Example 21

The system of one of examples 18 to 20, where the top and bottom surfaces of each DSC power module is in direct contact with an outer surface of a respective cooling channel of the plurality of cooling channels.

Example 22

The system of one of examples 18 to 21, where the top and bottom surfaces of each DSC power module are in direct contact with an outer surface of respective thermal interface materials, and each respective thermal interface material is in direct contact with a respective cooling channel of the plurality of cooling channels.

Example 23

The system of one of examples 18 to 22, further including a plurality of gate driver circuits, where each gate driver circuit of the plurality of gate driver circuits is configured to drive respective DSC power modules of respective stacks.

Example 24

The system of one of examples 18 to 23, where the DSC power modules of respective stacks are coupled in parallel, and where respective gate driver circuits are configured to drive the parallel coupled DSC power modules of the respective stacks.

Example 25

The system of one of examples 18 to 24, where each DSC power module includes a half-bridge circuit.

Example 26

The system of one of examples 18 to 25, where each gate driver circuit of the plurality of gate driver circuits includes a high-side gate driver circuit coupled to high-side transistors of respective half-bridge circuits of respective power modules; and a low-side gate driver circuit coupled to low-side transistors of respective half-bridge circuits of respective power modules.

Example 27

The system of one of examples 18 to 26, where the plurality of stacks of DSC power modules includes three stacks, the system further including a three-phase electrical motor electrically coupled to outputs of half-bridges of the plurality of DSC power modules.

Example 28

The system of one of examples 18 to 27, where the controller is further configured to disable the plurality of gate driver circuits when the blockage is detected or operate the plurality of gate driver circuits in a system safe state mode.

Example 29

The system of one of examples 18 to 28, where the controller is further configured to set a fault flag when the blockage is detected.

Example 30

The system of one of examples 18 to 29, where the controller is further configured to determine an absolute temperature of one or more DSC power modules, where detecting the blockage of the cooling pipe system includes detecting the blockage of the cooling pipe system when at least one of the one or more absolute temperatures is above a second temperature threshold.

Example 31

The system of one of examples 18 to 30, where the cooling pipe system is configured to circulate a liquid cooler material.

Example 32

The system of one of examples 18 to 31, where the liquid cooler material includes ethylene glycol.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
    monitoring a temperature difference between two double-side cooled (DSC) power modules of a plurality of DSC power modules arranged in stacks of DSC power modules, each DSC power module of the plurality of DSC power modules being thermally coupled with one or more cooling channels of a plurality of cooling channels of a cooling pipe system, and the two DSC power modules being thermally coupled with a same cooling channel of the plurality of cooling channels;
    comparing the temperature difference with a first temperature threshold;
    detecting a cooling pipe system blockage when the temperature difference is above the first temperature threshold; and
    after detecting the cooling pipe system blockage, disabling gate driver circuits coupled to the plurality of DSC power modules or operating the DSC power modules in a low-power mode.

2. The method of claim 1, further comprising monitoring absolute temperatures of one or more DSC power modules of the plurality of DSC power modules, wherein detecting the cooling pipe system blockage comprises detecting the cooling pipe system blockage when at least one absolute temperature of the one or more absolute temperatures is above a second temperature threshold.

3. The method of claim 1, further comprising:
    monitoring absolute temperatures of one or more DSC power modules of the plurality of DSC power modules;
    averaging the monitored absolute temperatures to produce an average temperature; and
    comparing the average temperature with a second temperature threshold, wherein detecting the cooling pipe system blockage comprises detecting the cooling pipe system blockage when the average temperature is above the second temperature threshold.

4. The method of claim 1, further comprising:
    comparing the temperature difference with a third temperature threshold; and
    setting a warning flag when the temperature difference is above the third temperature threshold and below the first temperature threshold.

5. The method of claim 1, further comprising operating the DSC power modules in a low-power mode by turning on all low side switches of the DSC power modules and turning off all high side switches of the DSC power modules.

6. The method of claim 1, wherein:
    monitoring the temperature difference between the two DSC power modules comprises monitoring the temperature difference between two adjacent DSC power modules of a first stack of the stacks of DSC power modules; and
    the method further comprises monitoring a second temperature difference between two adjacent DSC power modules of a second stack of the stacks of DSC power modules, wherein the two adjacent DSC power modules of the second stack are selected in the second stack such that they are shifted with respect to the two adjacent DSC power modules of the first stack along a stacking direction of the first and second stacks.

7. A circuit comprising:
a gate driver circuit configured to be coupled to a plurality of half-bridges, each half-bridge packaged in a double-side cooled (DSC) package;
an analog-to-digital converter (ADC) circuit having a first input configured to be coupled to a first temperature sensor thermally coupled to a first half-bridge of the plurality of half-bridges and a second input configured to be coupled to a second temperature sensor thermally coupled to a second half-bridge of the plurality of half-bridges; and
a controller configured to:
determine a temperature difference based on input signals at the first and second inputs of the ADC circuit, and
disable the gate driver circuit or activate a system safe state operation when the temperature difference is above a first temperature threshold.

8. The circuit of claim 7, wherein the gate driver circuit and the ADC circuit are disposed in a same monolithic semiconductor substrate.

9. The circuit of claim 7, further comprising the plurality of half-bridges, wherein each half-bridge of the plurality of half-bridges has a temperature sensor, and wherein each half-bridge and the respective temperature sensor are disposed in a same monolithic semiconductor substrate.

10. The circuit of claim 9, wherein each temperature sensor comprises a diode, and the circuit further comprises first and second current sources configured to be coupled to respective diodes of the first and second temperature sensors.

11. The circuit of claim 7, wherein the plurality of half-bridges is arranged as a stack of a plurality of stacks, each stack comprises a plurality of half-bridges, each half-bridge is packaged in a DSC package, each DSC package has a top surface and a bottom surface opposite the top surface, and each of the top and bottom surfaces of each DSC package is thermally coupled to a cooling channel of a cooling pipe system.

12. The circuit of claim 7, wherein the gate driver circuit comprises an isolated gate driver circuit, and the ADC circuit comprises an isolated ADC circuit.

13. The circuit of claim 7, wherein the ADC circuit comprises a multiplexer coupled between the first and second inputs of the ADC circuit and an ADC core, wherein the ADC core is configured to perform analog-to-digital conversions.

14. The circuit of claim 7, wherein the controller comprises a window comparator configured to compare a first temperature of the first temperature sensor and a second temperature of the second temperature sensor with the first temperature threshold.

15. A system comprising:
a plurality of stacks of double-side cooled (DSC) power modules, each DSC power module having a top surface and a bottom surface opposite the top surface;
a cooling pipe system comprising a plurality of cooling channels, wherein the top and bottom surfaces of each DSC power module of each stack are thermally coupled with one or more cooling channels of the plurality of cooling channels; and
a controller configured to:
determine one or more temperature differences between two DSC power modules that are thermally coupled to a same cooling channel of the plurality of cooling channels, and
detect a blockage of the cooling pipe system when at least one of the one or more temperature differences is above a first temperature threshold.

16. The system of claim 15, wherein determining one or more temperature differences between two DSC power modules comprises:
determining a first temperature difference between two adjacent DSC power modules of a first stack of the stacks of DSC power modules; and
determining a second temperature difference between two adjacent DSC power modules of a second stack of the stacks of DSC power modules, wherein the two adjacent DSC power modules of the second stack are selected in the second stack such that they are shifted with respect to the two adjacent DSC power modules of the first stack along a stacking direction of the first and second stacks.

17. The system of claim 15, wherein each of the plurality of cooling channels is thermally coupled with at least the top or the bottom surface of one of the plurality of DSC power modules of each stack.

18. The system of claim 15, wherein the top and bottom surfaces of each DSC power module are in direct contact with an outer surface of a respective cooling channel of the plurality of cooling channels.

19. The system of claim 15, wherein the top and bottom surfaces of each DSC power module are in direct contact with an outer surface of respective thermal interface materials, and each respective thermal interface material is in direct contact with a respective cooling channel of the plurality of cooling channels.

20. The system of claim 15, further comprising a plurality of gate driver circuits, wherein each gate driver circuit of the plurality of gate driver circuits is configured to drive respective DSC power modules of respective stacks.

21. The system of claim 20, wherein the DSC power modules of respective stacks are coupled in parallel, and wherein respective gate driver circuits are configured to drive the parallel coupled DSC power modules of the respective stacks.

22. The system of claim 21, wherein each DSC power module comprises a half-bridge circuit.

23. The system of claim 22, wherein the plurality of stacks of DSC power modules comprises three stacks, the system further comprising a three-phase electrical motor electrically coupled to outputs of half-bridges of the plurality of DSC power modules.

24. The system of claim 20, wherein the controller is further configured to disable the plurality of gate driver circuits when the blockage is detected or operate the plurality of gate driver circuits in a system safe state mode.

25. The system of claim 15, wherein the controller is further configured to determine an absolute temperature of one or more DSC power modules, wherein detecting the blockage of the cooling pipe system comprises detecting the blockage of the cooling pipe system when at least one of the one or more absolute temperatures is above a second temperature threshold.

* * * * *